United States Patent
Radosavljevic et al.

(10) Patent No.: US 7,898,041 B2
(45) Date of Patent: Mar. 1, 2011

(54) BLOCK CONTACT ARCHITECTURES FOR NANOSCALE CHANNEL TRANSISTORS

(75) Inventors: Marko Radosavljevic, Beaverton, OR (US); Amlan Majumdar, Portland, OR (US); Brian S. Doyle, Portland, OR (US); Jack Kavalieros, Portland, OR (US); Mark L. Doczy, Beaverton, OR (US); Justin K. Brask, Portland, OR (US); Uday Shah, Portland, OR (US); Suman Datta, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 11/855,823

(22) Filed: Sep. 14, 2007

(65) Prior Publication Data

US 2008/0258207 A1    Oct. 23, 2008

Related U.S. Application Data

(62) Division of application No. 11/173,866, filed on Jun. 30, 2005, now Pat. No. 7,279,375.

(51) Int. Cl.
*H01L 27/01* (2006.01)
(52) U.S. Cl. ......... 257/401; 257/388; 257/288; 257/213; 257/E29.13
(58) Field of Classification Search .................. 257/368, 257/401
See application file for complete search history.

(56) References Cited

U.S. PATENT DOCUMENTS

| | | | |
|---|---|---|---|
| 4,231,149 A | 11/1980 | Chapman et al. |
| 4,487,652 A | 12/1984 | Almgren |
| 4,711,701 A | 12/1987 | McLevige |
| 4,818,715 A | 4/1989 | Chao |
| 4,905,063 A | 2/1990 | Beltram et al. |
| 4,906,589 A | 3/1990 | Chao |
| 4,907,048 A | 3/1990 | Huang |
| 4,994,873 A | 2/1991 | Madan |
| 4,996,574 A | 2/1991 | Shirasaki |
| 5,023,203 A | 6/1991 | Choi |
| 5,120,666 A | 6/1992 | Gotou |
| 5,124,777 A | 6/1992 | Lee |
| 5,179,037 A | 1/1993 | Seabaugh |
| 5,216,271 A | 6/1993 | Takagi et al. |
| 5,278,102 A | 1/1994 | Horie |

(Continued)

FOREIGN PATENT DOCUMENTS

DE        10203998        8/2003

(Continued)

OTHER PUBLICATIONS

International Search Report & Written Opinion from PCT/US2006/037643 mailed on Jan. 24, 2007, 14 pgs.

(Continued)

*Primary Examiner* — Leonardo Andújar
*Assistant Examiner* — William Harriston
(74) *Attorney, Agent, or Firm* — Blakely, Sokoloff, Taylor & Zafman LLP

(57) ABSTRACT

A contact architecture for nanoscale channel devices having contact structures coupling to and extending between source or drain regions of a device having a plurality of parallel semiconductor bodies. The contact structures being able to contact parallel semiconductor bodies having sub-lithographic pitch.

20 Claims, 8 Drawing Sheets

U.S. PATENT DOCUMENTS

| | | | |
|---|---|---|---|
| 5,308,999 A | 5/1994 | Gotou | |
| 5,328,810 A * | 7/1994 | Lowrey et al. | 430/313 |
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,391,506 A * | 2/1995 | Tada et al. | 438/268 |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,514,885 A | 5/1996 | Myrick | |
| 5,521,859 A | 5/1996 | Ema et al. | |
| 5,543,351 A | 8/1996 | Hirai et al. | |
| 5,545,586 A | 8/1996 | Koh | |
| 5,563,077 A | 10/1996 | Ha | |
| 5,576,227 A | 11/1996 | Hsu | |
| 5,578,513 A | 11/1996 | Maegawa | |
| 5,595,919 A | 1/1997 | Pan | |
| 5,595,941 A * | 1/1997 | Okamoto et al. | 216/46 |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,698,869 A | 12/1997 | Yoshimi et al. | |
| 5,701,016 A | 12/1997 | Burroughes et al. | |
| 5,716,879 A | 2/1998 | Choi et al. | |
| 5,739,544 A | 4/1998 | Yuki et al. | |
| 5,760,442 A | 6/1998 | Shigyo et al. | |
| 5,770,513 A | 6/1998 | Okaniwa et al. | |
| 5,773,331 A | 6/1998 | Solomon et al. | |
| 5,776,821 A | 7/1998 | Haskell et al. | |
| 5,793,088 A | 8/1998 | Choi et al. | |
| 5,804,848 A | 9/1998 | Mukai | |
| 5,811,324 A | 9/1998 | Yang | |
| 5,814,895 A | 9/1998 | Hirayama | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,856,225 A | 1/1999 | Lee et al. | |
| 5,859,456 A * | 1/1999 | Efland et al. | 257/335 |
| 5,880,015 A | 3/1999 | Hata | |
| 5,888,309 A | 3/1999 | Yu | |
| 5,889,304 A | 3/1999 | Watanabe | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea et al. | |
| 5,965,914 A | 10/1999 | Miyamoto | |
| 5,976,767 A | 11/1999 | Li | |
| 5,985,726 A | 11/1999 | Yu et al. | |
| 6,013,926 A | 1/2000 | Oku et al. | |
| 6,018,176 A | 1/2000 | Lim | |
| 6,031,249 A | 2/2000 | Yamazaki et al. | |
| 6,051,452 A | 4/2000 | Shigyo et al. | |
| 6,054,355 A | 4/2000 | Inumiya et al. | |
| 6,063,675 A | 5/2000 | Rodder | |
| 6,063,677 A | 5/2000 | Rodder et al. | |
| 6,066,869 A | 5/2000 | Noble et al. | |
| 6,087,208 A | 7/2000 | Krivokapic et al. | |
| 6,093,621 A | 7/2000 | Tseng | |
| 6,114,201 A | 9/2000 | Wu | |
| 6,114,206 A | 9/2000 | Yu | |
| 6,117,741 A | 9/2000 | Chatterjee et al. | |
| 6,120,846 A | 9/2000 | Hintermaier et al. | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,163,053 A | 12/2000 | Kawashima | |
| 6,165,880 A | 12/2000 | Yaung et al. | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,218,309 B1 | 4/2001 | Miller et al. | |
| 6,251,729 B1 | 6/2001 | Montree et al. | |
| 6,251,763 B1 | 6/2001 | Inumiya et al. | |
| 6,252,284 B1 | 6/2001 | Muller et al. | |
| 6,259,135 B1 | 7/2001 | Hsu et al. | |
| 6,261,921 B1 | 7/2001 | Yen et al. | |
| 6,262,456 B1 | 7/2001 | Yu et al. | |
| 6,274,503 B1 | 8/2001 | Hsieh | |
| 6,287,924 B1 | 9/2001 | Chao et al. | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,319,807 B1 | 11/2001 | Yeh et al. | |
| 6,335,251 B2 | 1/2002 | Miyano et al. | |
| 6,358,800 B1 | 3/2002 | Tseng | |
| 6,359,311 B1 | 3/2002 | Colinge et al. | |
| 6,362,111 B1 | 3/2002 | Laaksonen et al. | |
| 6,368,923 B1 | 4/2002 | Huang | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,407,442 B2 | 6/2002 | Inoue et al. | |
| 6,413,802 B1 * | 7/2002 | Hu et al. | 438/151 |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,457,890 B1 | 10/2002 | Kohlruss et al. | |
| 6,458,662 B1 | 10/2002 | Yu | |
| 6,459,123 B1 | 10/2002 | Enders et al. | |
| 6,465,290 B1 | 10/2002 | Suguro et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,479,866 B1 | 11/2002 | Xiang | |
| 6,483,146 B2 | 11/2002 | Lee et al. | |
| 6,483,151 B2 | 11/2002 | Wakabayashi et al. | |
| 6,483,156 B1 | 11/2002 | Adkisson et al. | |
| 6,495,403 B1 | 12/2002 | Skotnicki et al. | |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,525,403 B2 | 2/2003 | Inaba et al. | |
| 6,526,996 B1 | 3/2003 | Chang et al. | |
| 6,534,807 B2 | 3/2003 | Mandelman et al. | |
| 6,537,862 B2 | 3/2003 | Song | |
| 6,537,885 B1 | 3/2003 | Kang et al. | |
| 6,537,901 B2 | 3/2003 | Cha et al. | |
| 6,541,829 B2 | 4/2003 | Nishinohara et al. | |
| 6,555,879 B1 | 4/2003 | Krivokapic et al. | |
| 6,562,665 B1 | 5/2003 | Yu | |
| 6,562,687 B1 | 5/2003 | Deleonibus | |
| 6,566,734 B2 | 5/2003 | Sugihara et al. | |
| 6,583,469 B1 | 6/2003 | Fried et al. | |
| 6,605,498 B1 | 8/2003 | Murthy et al. | |
| 6,610,576 B2 | 8/2003 | Nowak | |
| 6,611,029 B1 | 8/2003 | Ahmed et al. | |
| 6,630,388 B2 | 10/2003 | Ishii et al. | |
| 6,635,909 B2 | 10/2003 | Clark et al. | |
| 6,642,090 B1 | 11/2003 | Fried et al. | |
| 6,642,114 B2 | 11/2003 | Nakamura | |
| 6,645,797 B1 | 11/2003 | Buynoski et al. | |
| 6,645,826 B2 | 11/2003 | Yamazaki et al. | |
| 6,645,861 B2 | 11/2003 | Cabral, Jr. et al. | |
| 6,656,853 B2 | 12/2003 | Ito | |
| 6,657,259 B2 | 12/2003 | Fried et al. | |
| 6,660,598 B2 | 12/2003 | Hanafi et al. | |
| 6,664,160 B2 | 12/2003 | Park et al. | |
| 6,680,240 B1 | 1/2004 | Maszara | |
| 6,686,231 B1 | 2/2004 | Ahmed et al. | |
| 6,689,650 B2 | 2/2004 | Gambino et al. | |
| 6,693,324 B2 | 2/2004 | Maegawa et al. | |
| 6,696,366 B1 | 2/2004 | Flanner et al. | |
| 6,705,571 B2 | 3/2004 | Shay et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,686 B1 * | 4/2004 | Buynoski et al. | 438/157 |
| 6,716,690 B1 | 4/2004 | Wang et al. | |

| | | |
|---|---|---|
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,765,303 B1 | 7/2004 | Krivokapic et al. |
| 6,770,516 B2 | 8/2004 | Wu et al. |
| 6,774,390 B2 | 8/2004 | Sugiyama et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,884,154 B2 | 4/2005 | Mizushima et al. |
| 6,885,055 B2 | 4/2005 | Lee |
| 6,891,234 B1 | 5/2005 | Connelly et al. |
| 6,897,527 B2 | 5/2005 | Dakshina-Murthy et al. |
| 6,902,962 B2 | 6/2005 | Yeo et al. |
| 6,909,147 B2 | 6/2005 | Aller et al. |
| 6,909,151 B2 * | 6/2005 | Hareland et al. ............ 257/369 |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,955,961 B1 * | 10/2005 | Chung ........................... 438/241 |
| 6,960,517 B2 | 11/2005 | Rios et al. |
| 6,967,351 B2 | 11/2005 | Fried et al. |
| 6,974,738 B2 | 12/2005 | Hareland et al. |
| 6,975,014 B1 | 12/2005 | Krivokapic et al. |
| 6,977,415 B2 | 12/2005 | Matsuo |
| 6,998,301 B1 | 2/2006 | Yu et al. |
| 6,998,318 B2 | 2/2006 | Park |
| 7,013,447 B2 * | 3/2006 | Mathew et al. ................. 716/11 |
| 7,018,551 B2 | 3/2006 | Beintner et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,056,794 B2 | 6/2006 | Ku et al. |
| 7,060,539 B2 * | 6/2006 | Chidambarrao et al. ...... 438/142 |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,084,018 B1 | 8/2006 | Ahmed et al. |
| 7,105,390 B2 * | 9/2006 | Brask et al. ................... 438/149 |
| 7,105,891 B2 | 9/2006 | Visokay |
| 7,105,894 B2 * | 9/2006 | Yeo et al. ...................... 257/347 |
| 7,105,934 B2 * | 9/2006 | Anderson et al. ............. 257/213 |
| 7,112,478 B2 | 9/2006 | Grupp et al. |
| 7,115,945 B2 | 10/2006 | Lee et al. |
| 7,119,402 B2 | 10/2006 | Kinoshita et al. |
| 7,122,463 B2 | 10/2006 | Ohuchi |
| 7,141,856 B2 | 11/2006 | Lee et al. |
| 7,154,118 B2 | 12/2006 | Lindert |
| 7,163,851 B2 | 1/2007 | Abadeer et al. |
| 7,163,898 B2 * | 1/2007 | Mariani et al. ................ 438/717 |
| 7,183,137 B2 | 2/2007 | Lee et al. |
| 7,187,043 B2 | 3/2007 | Arai et al. |
| 7,214,991 B2 * | 5/2007 | Yeo et al. ...................... 257/401 |
| 7,238,564 B2 | 7/2007 | Ko et al. |
| 7,241,653 B2 | 7/2007 | Hareland et al. |
| 7,247,547 B2 | 7/2007 | Zhu et al. |
| 7,250,645 B1 | 7/2007 | Wang et al. |
| 7,291,886 B2 | 11/2007 | Doris et al. |
| 7,339,241 B2 * | 3/2008 | Orlowski et al. ............. 257/401 |
| 7,348,284 B2 | 3/2008 | Doyle et al. |
| 7,348,642 B2 * | 3/2008 | Nowak ......................... 257/401 |
| 7,354,817 B2 | 4/2008 | Watanabe et al. |
| 7,358,121 B2 | 4/2008 | Chau et al. |
| 7,396,730 B2 | 7/2008 | Li |
| 7,452,778 B2 * | 11/2008 | Chen et al. .................... 438/283 |
| 7,456,471 B2 * | 11/2008 | Anderson et al. ............. 257/331 |
| 7,456,476 B2 * | 11/2008 | Hareland et al. .............. 257/349 |
| 7,479,421 B2 * | 1/2009 | Kavalieros et al. ............ 438/197 |
| 7,585,734 B2 * | 9/2009 | Kang et al. .................... 438/283 |
| 7,612,416 B2 * | 11/2009 | Takeuchi et al. .............. 257/377 |
| 7,655,989 B2 * | 2/2010 | Zhu et al. ...................... 257/401 |
| 7,701,018 B2 * | 4/2010 | Yamagami et al. ............ 257/401 |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 * | 1/2002 | Hieda ............................ 257/262 |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Ieong et al. |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0190766 A1 | 10/2003 | Gonzalez et al. |
| 2003/0201458 A1 | 10/2003 | Clark et al. |
| 2003/0203636 A1 * | 10/2003 | Anthony ....................... 438/694 |
| 2003/0227036 A1 | 12/2003 | Sugiyama et al. |
| 2004/0016968 A1 | 1/2004 | Coronel et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 * | 2/2004 | Chau et al. .................... 257/401 |
| 2004/0038436 A1 | 2/2004 | Mori et al. |
| 2004/0038533 A1 | 2/2004 | Liang |
| 2004/0061178 A1 | 4/2004 | Lin et al. |

| | | | |
|---|---|---|---|
| 2004/0063286 A1 | 4/2004 | Kim et al. | |
| 2004/0070020 A1 | 4/2004 | Fujiwara et al. | |
| 2004/0075149 A1 | 4/2004 | Fitzgerald et al. | |
| 2004/0082125 A1 | 4/2004 | Hou | |
| 2004/0092062 A1 | 5/2004 | Ahmed et al. | |
| 2004/0092067 A1 | 5/2004 | Hanafi et al. | |
| 2004/0094807 A1 | 5/2004 | Chau et al. | |
| 2004/0099903 A1 | 5/2004 | Yeo et al. | |
| 2004/0099966 A1 | 5/2004 | Chau et al. | |
| 2004/0108523 A1* | 6/2004 | Chen et al. | 257/202 |
| 2004/0108558 A1 | 6/2004 | Kwak et al. | |
| 2004/0110097 A1 | 6/2004 | Ahmed et al. | |
| 2004/0113181 A1* | 6/2004 | Wicker | 257/246 |
| 2004/0119100 A1 | 6/2004 | Nowak et al. | |
| 2004/0124492 A1 | 7/2004 | Matsuo | |
| 2004/0126975 A1 | 7/2004 | Ahmed et al. | |
| 2004/0132236 A1 | 7/2004 | Doris | |
| 2004/0145000 A1 | 7/2004 | An et al. | |
| 2004/0145019 A1 | 7/2004 | Dakshina-Murthy et al. | |
| 2004/0166642 A1 | 8/2004 | Chen et al. | |
| 2004/0169221 A1 | 9/2004 | Ko et al. | |
| 2004/0169269 A1* | 9/2004 | Yeo et al. | 257/692 |
| 2004/0180491 A1 | 9/2004 | Arai et al. | |
| 2004/0191980 A1 | 9/2004 | Rios et al. | |
| 2004/0195624 A1 | 10/2004 | Liu et al. | |
| 2004/0198003 A1 | 10/2004 | Yeo et al. | |
| 2004/0203254 A1 | 10/2004 | Conley et al. | |
| 2004/0209463 A1 | 10/2004 | Kim et al. | |
| 2004/0217420 A1 | 11/2004 | Yeo et al. | |
| 2004/0219722 A1 | 11/2004 | Pham et al. | |
| 2004/0219780 A1 | 11/2004 | Ohuchi | |
| 2004/0222473 A1 | 11/2004 | Risaki | |
| 2004/0227187 A1 | 11/2004 | Cheng et al. | |
| 2004/0238887 A1* | 12/2004 | Nihey | 257/347 |
| 2004/0238915 A1 | 12/2004 | Chen et al. | |
| 2004/0256647 A1 | 12/2004 | Lee et al. | |
| 2004/0262683 A1 | 12/2004 | Bohr et al. | |
| 2004/0262699 A1 | 12/2004 | Rios et al. | |
| 2004/0266076 A1 | 12/2004 | Doris et al. | |
| 2005/0019993 A1 | 1/2005 | Lee et al. | |
| 2005/0020020 A1 | 1/2005 | Collaert et al. | |
| 2005/0035415 A1 | 2/2005 | Yeo et al. | |
| 2005/0040444 A1 | 2/2005 | Cohen | |
| 2005/0059214 A1 | 3/2005 | Cheng et al. | |
| 2005/0073060 A1 | 4/2005 | Datta et al. | |
| 2005/0093028 A1 | 5/2005 | Chambers | |
| 2005/0093067 A1 | 5/2005 | Yeo et al. | |
| 2005/0093075 A1 | 5/2005 | Bentum et al. | |
| 2005/0093154 A1 | 5/2005 | Kottantharayil et al. | |
| 2005/0104055 A1 | 5/2005 | Kwak et al. | |
| 2005/0110082 A1 | 5/2005 | Cheng | |
| 2005/0116289 A1 | 6/2005 | Boyd et al. | |
| 2005/0118790 A1 | 6/2005 | Lee et al. | |
| 2005/0127362 A1* | 6/2005 | Zhang et al. | 257/66 |
| 2005/0127632 A1 | 6/2005 | Gehret | |
| 2005/0133829 A1* | 6/2005 | Kunii et al. | 257/280 |
| 2005/0133866 A1 | 6/2005 | Chau et al. | |
| 2005/0136584 A1 | 6/2005 | Boyanov et al. | |
| 2005/0139860 A1 | 6/2005 | Snyder et al. | |
| 2005/0145894 A1 | 7/2005 | Chau et al. | |
| 2005/0145941 A1 | 7/2005 | Bedell et al. | |
| 2005/0145944 A1 | 7/2005 | Murthy et al. | |
| 2005/0148131 A1 | 7/2005 | Brask | |
| 2005/0148137 A1 | 7/2005 | Brask et al. | |
| 2005/0153494 A1 | 7/2005 | Ku et al. | |
| 2005/0156171 A1 | 7/2005 | Brask et al. | |
| 2005/0156202 A1 | 7/2005 | Rhee et al. | |
| 2005/0156227 A1 | 7/2005 | Jeng | |
| 2005/0161739 A1 | 7/2005 | Anderson et al. | |
| 2005/0162928 A1* | 7/2005 | Rosmeulen | 365/185.29 |
| 2005/0167766 A1 | 8/2005 | Yagishita | |
| 2005/0170593 A1 | 8/2005 | Kang et al. | |
| 2005/0184316 A1 | 8/2005 | Kim et al. | |
| 2005/0189583 A1 | 9/2005 | Kim et al. | |
| 2005/0199919 A1 | 9/2005 | Liu | |
| 2005/0202604 A1* | 9/2005 | Cheng et al. | 438/151 |
| 2005/0215014 A1 | 9/2005 | Ahn et al. | |
| 2005/0215022 A1 | 9/2005 | Adam et al. | |
| 2005/0224797 A1 | 10/2005 | Ko et al. | |
| 2005/0224800 A1 | 10/2005 | Lindert et al. | |
| 2005/0227498 A1 | 10/2005 | Furukawa et al. | |
| 2005/0230763 A1 | 10/2005 | Huang et al. | |
| 2005/0233156 A1 | 10/2005 | Senzaki | |
| 2005/0239252 A1 | 10/2005 | Ahn et al. | |
| 2005/0255642 A1 | 11/2005 | Liu et al. | |
| 2005/0266645 A1 | 12/2005 | Park | |
| 2005/0272192 A1 | 12/2005 | Oh et al. | |
| 2005/0277294 A1 | 12/2005 | Schaeffer et al. | |
| 2005/0280121 A1 | 12/2005 | Doris et al. | |
| 2006/0014338 A1* | 1/2006 | Doris et al. | 438/197 |
| 2006/0040054 A1 | 2/2006 | Pearlstein et al. | |
| 2006/0043500 A1* | 3/2006 | Chen et al. | 257/401 |
| 2006/0046521 A1 | 3/2006 | Vaartstra et al. | |
| 2006/0063469 A1 | 3/2006 | Talieh et al. | |
| 2006/0068591 A1 | 3/2006 | Radosavljevic et al. | |
| 2006/0071299 A1 | 4/2006 | Doyle et al. | |
| 2006/0086977 A1 | 4/2006 | Shah et al. | |
| 2006/0154478 A1 | 7/2006 | Hsu et al. | |
| 2006/0170066 A1* | 8/2006 | Mathew et al. | 257/401 |
| 2006/0172480 A1 | 8/2006 | Wang et al. | |
| 2006/0172497 A1* | 8/2006 | Hareland et al. | 438/286 |
| 2006/0180859 A1* | 8/2006 | Radosavljevic et al. | 257/347 |
| 2006/0202270 A1 | 9/2006 | Son et al. | |
| 2006/0204898 A1* | 9/2006 | Gutsche et al. | 430/313 |
| 2006/0205164 A1 | 9/2006 | Ko et al. | |
| 2006/0211184 A1 | 9/2006 | Boyd et al. | |
| 2006/0220131 A1* | 10/2006 | Kinoshita et al. | 257/347 |
| 2006/0227595 A1 | 10/2006 | Chuang et al. | |
| 2006/0240622 A1 | 10/2006 | Lee et al. | |
| 2006/0244066 A1* | 11/2006 | Yeo et al. | 257/347 |
| 2006/0263699 A1 | 11/2006 | Abatchev et al. | 430/5 |
| 2006/0281266 A1* | 12/2006 | Wells | 438/299 |
| 2006/0281325 A1 | 12/2006 | Chou et al. | |
| 2007/0001219 A1* | 1/2007 | Radosavljevic et al. | 257/327 |
| 2007/0023795 A1 | 2/2007 | Nagano et al. | |
| 2007/0029624 A1* | 2/2007 | Nowak | 257/401 |
| 2007/0045735 A1* | 3/2007 | Orlowski et al. | 257/347 |
| 2007/0045748 A1 | 3/2007 | Booth, Jr. et al. | |
| 2007/0048930 A1 | 3/2007 | Figura et al. | |
| 2007/0052041 A1* | 3/2007 | Sorada et al. | 257/392 |
| 2007/0093010 A1 | 4/2007 | Mathew et al. | |
| 2007/0108514 A1 | 5/2007 | Inoue et al. | |
| 2007/0187682 A1* | 8/2007 | Takeuchi et al. | 257/64 |
| 2007/0241414 A1* | 10/2007 | Narihiro | 257/401 |
| 2007/0262389 A1 | 11/2007 | Chau et al. | |
| 2008/0017890 A1* | 1/2008 | Yuan et al. | 257/213 |
| 2008/0017934 A1* | 1/2008 | Kim et al. | 257/401 |
| 2008/0111163 A1* | 5/2008 | Russ et al. | 257/280 |
| 2008/0116515 A1* | 5/2008 | Gossner et al. | 257/347 |
| 2008/0128797 A1* | 6/2008 | Dyer et al. | 257/328 |
| 2008/0212392 A1* | 9/2008 | Bauer | 365/230.05 |
| 2008/0237655 A1* | 10/2008 | Nakabayashi et al. | 257/255 |
| 2008/0258207 A1* | 10/2008 | Radosavljevic et al. | 257/327 |
| 2009/0061572 A1* | 3/2009 | Hareland et al. | 438/157 |
| 2009/0099181 A1* | 4/2009 | Wurster et al. | 514/235.5 |
| 2010/0200923 A1* | 8/2010 | Chen et al. | 257/365 |

FOREIGN PATENT DOCUMENTS

| | | |
|---|---|---|
| EP | 0510667 | 10/1992 |
| EP | 0 623 963 A1 | 11/1994 |
| EP | 1091413 | 4/2001 |
| EP | 1 202 335 A2 | 5/2002 |
| EP | 1 566 844 A2 | 8/2005 |
| GB | 2156149 | 10/1985 |
| JP | 56073454 | 6/1981 |
| JP | 59145538 | 8/1984 |
| JP | 2303048 | 12/1990 |
| JP | 06005856 | 1/1994 |
| JP | 6151387 | 5/1994 |
| JP | 06177089 | 6/1994 |
| JP | 06224440 | 8/1994 |
| JP | 9162301 | 6/1997 |
| JP | 20037842 | 2/2000 |
| JP | 2000037842 | 2/2000 |
| JP | 2001-189453 | 7/2001 |

| | | |
|---|---|---|
| JP | 2001-338987 | 12/2001 |
| JP | 2002-298051 | 10/2002 |
| JP | 2003-298051 | 10/2003 |
| TW | 200414538 | 8/1992 |
| TW | 200518310 | 11/1992 |
| TW | 516232 | 1/2003 |
| TW | 561530 | 1/2003 |
| TW | 548799 | 8/2003 |
| TW | 200402872 | 2/2004 |
| TW | 200405408 | 4/2004 |
| TW | 200417034 | 9/2004 |
| WO | WO-0243151 | 5/2002 |
| WO | WO-02095814 | 11/2002 |
| WO | WO-03003442 | 1/2003 |
| WO | WO-2004/059726 | 7/2004 |
| WO | WO-2005036651 | 4/2005 |

OTHER PUBLICATIONS

Office Action from U.S. Appl. No. 11/173,866 mailed, Feb. 8, 2007, 21 pgs.
Notice of Allowance from U.S. Appl. No. 11/173,866 mailed, May 31, 2007, 7 pgs.
Final Office Action from U.S. Appl. No. 11/158,661 mailed Jan. 15, 2008, 25 pgs.
Office Action from U.S. Appl. No. 11/080,765 mailed May 2, 2007, 47 pgs.
Final Office Action from U.S. Appl. No. 11/080,765 mailed Nov. 13, 2007, 13 pgs.
Office Action from PRC Application No. 200580007279.5, PCT/US05/000947, mailed Apr. 4, 2008, 2 pgs.
Written Opinion from Singapore Patent Application No. 200604766-6 mailed Apr. 4, 2008, 4 pgs.
Office Action from Taiwan Patent Application No. 95122087 mailed Jun. 10, 2008, 8 pgs.
IPO Search Report for Application No. 094136197, date mailed Sep. 19, 2008, 1 pg.
Office Action from European Patent Application No. 03817699.6 mailed Aug. 29, 2007, 3 pgs.
Written Opinion from Patent Application No. 2005070131 mailed Mar. 18, 2007, 4 pgs.
International Preliminary Report on Patentability from Application No. PCT/US2006/024516 mailed Jan. 10, 2008, 11 pgs.
International Preliminary Report on Patentability from Application No. PCT/US/2006/037634 mailed Apr. 10, 2008, 11 pgs.
International Preliminary Report on Patentability from Application No. PCT/US/2006/025751 mailed Jan. 9, 2008, 8 pgs.
Office Action from Taiwan Patent Application No. 95123858, dated Oct. 9, 2008, 10pgs.
Office Action from Taiwan Patent Application No. 95123858, dated Mar. 3, 2009, 4pgs.
Office Action from U.S. Appl. No. 11/234,014 mailed Jan. 23, 2008, 9 pgs.
Office Action from U.S. Appl. No. 12/025,665 mailed on Nov. 12, 2008, 8 pgs.
International Search Report PCT/US2003/40320 mailed Jun. 2, 2004, 6 pgs.
Office Action from Taiwan Patent Application No. 95135820 mailed on Jan. 9, 2009, 14 pgs.
"Office Action", European Patent Application No. 06815547.2 (P22156EP), Mailed Sep. 9, 2008, 3 pages.
Chau, Robert, et al., Advanced Depleted-Substrate Transistors: Single-Gate, Double-Gate and Tri-Gate (invited paper), Components Research, Logic Technology Development, Hillsboro, OR, 2 pgs.
Collaert, N., et al., "A Functional 41-stage ring oscillator using scaled FinFET devices with 25-nm gate lengths and 10-nm fin widths applicable for the 45-nm Cmos node", IEEE Electron Device Letters, vol. 25, No. 8, Aug. 2004, 3 pgs.
Javey, Ali, et al., "Ballistic Carbon Nanotube Field-Effect 424, Aug. 7, 2003, 4 pgs., Transistors", Nature, vol. 424, Aug. 7, 2003, 4 pgs.
Tang, Stepehn H., et al., "FinFET—A Quasi-Planar Double-Gate MOSFET", 2001 IEEE International Solid-State Circuits Conference, Feb. 6, 2001, 3 pgs.
Tokoro, Kenji, et al., "Anisotropic Etching Properties of Silicon in KOH and TMAH Solutions", International Symposium on Micromechatronics and Human Service, IEEE, 1998, 6 pgs.
Wolf, Stanley, et al., "Wet Etching Silicon", Silicon Processing for the VLSI Era, vol. 1: Process Technology, Sep. 1986, 3 pgs.
Yang, Fu-Liang, et al, "25nm CMOS Omega FET's," IEEE 2002, 10.3.1-10.3.4.
Office Action from U.S. Appl. No. 11/240,487 mailed Mar. 17, 2009, 13 pgs.
Office Action from U.S. Appl. No. 11/322,795 mailed Mar. 4, 2009, 12 pgs.
Office Action from Taiwan Patent Application No. 95122087 mailed Dec. 16, 2008, 14 pgs.
German Office Action for German Patent Application No. 11 2006 003 576.2-33 mailed Dec. 12, 2008, 3 pgs.
Office Action from U.S. Patent Application No. 11/154,138 mailed Jun. 23, 2009, 14 pgs.
Office Action from Taiwan Patent Application No. 95135820 mailed Jun. 4, 2009, 18 pgs.
Second Office Action from Chinese Patent Application No. 200580032314.9 mailed May 8, 2009, 14 pgs.
Final Office Action from U.S. Appl. No. 12/025,665 mailed Jun. 10, 2009, 10 pgs.
Non-Final Office Action from U.S. Appl. No. 11/322,795 Mailed Jul. 28, 2009, 18 pgs.
Office Action for Taiwan Application No. 95134963 (P22156TW) issued Jun. 1, 2009; incl. translation, Whole document.
Final Office Action from U.S. Appl. No. 11/240,487 mailed Sep. 21, 2009, 22 Pages.
Non-Final Office Action for U.S. Appl. No. 12/259,464, Mailed Oct. 20, 2009, 41.
Notice of Preliminary Rejection mailed Sep. 14, 2009 for Korean Application No. 10-2007-7030988 incl. translation, (Sep. 14, 2009), 4 pages.
Office Action for EP Application No. 05711376.3 mailed Jan. 11, 2010, 5 pages.
Office Action for German Application No. 112006001735.7 with translation mailed Oct. 20, 2009, 6 pages.
Office Action from Taiwan Patent Application No. 95135820 mailed Oct. 22, 2009, 5 pgs.
2nd OA KR 10-2007-7030988 mailed Mar. 12, 2010 3 pgs.
Chau, Robert, Final Office Action mailed Feb. 17, 2010, 18 pages.
Wang, X., et al., "Band alignments in sidewall strained Si/strained SiGe heterostructures", (May 28, 2002), 1-5.
Office Action from Chinese Patent Application No. 200680023301.X mailed Jun. 26, 2009, whole document.
"International Preliminary Report on Patentability", PCT/US2004/032442, (Apr. 13, 2006), 13 pgs.
"Invitation to Pay Additional Fees", PCT/US2004/032442, (Apr. 12, 2005), 5 pgs.
"International Search Report & Written Opinion", PCT/US2004/032442, (Jun. 16, 2005), 22 pgs.
"International Search Report & Written Opinion", PCT/US2006/000378, (May 24, 2006), 11 pgs.
"International Preliminary Report on Patentability", PCT/US2005/010505, (Oct. 12, 2006), 16 pgs.
"International Search Report & Written Opinion", PCT/US2005/010505, (Aug. 26, 2005), 24 pgs.
"International Search Report & Written Opinion", PCT/US2005/000947, (May 3, 2005), 7 pgs.
"International Search Report", PCT/US 03/26242, (Jan. 26, 2004), 8 pgs.
"International Search Report", PCT/US 03/39727, (Apr. 27, 2004), 6 pgs.
"International Search Report", PCT/US2003/40320, (Jun. 2, 2004), 6 pgs.
"International Search Report & Written Opinion", PCT/US2006/024516, (Jan. 17, 2007), 18 pgs.

"International Search Report & Written Opinion", PCT/US2006/037634, (May 31, 2007), 21 pgs.

"International Search Report & Written Opinion", PCT/US2006/025751, (Dec. 6, 2006), 14 pgs.

"International Search Report & Written Opinion", PCT/US2005/035380, (Feb. 13, 2006), 14 pgs.

"International Search Report & Written Opinion", PCT/US2005/033439, (Jan. 31, 2006), 7 pgs.

"International Search Report & Written Opinion", PCT/US2005/037169, (Feb. 23, 2006), 11 pgs.

"International Search Report & Written Opinion", PCT/US2004/032442, (Jun. 16, 2006), 12 pgs.

"International Search Report and Written Opinion", PCT/US2005/010505, (Aug. 26, 2005), 24 pgs.

"International Search Report and Written Opinion", PCT/US2005/020339, (Oct. 4, 2005), 11 pgs.

Auth, Christopher P., et al., "Vertical, Fully-Depleted, Surrounding Gate MOSFETs on sub-0.1nm Thick Silicon Pillars", *54th Annual Device Research Conference Digest*, IEEE, (1996), 108-109.

Buchanan, D. A., et al., "Fabrication of Midgap Metal Gates Compatible With Ultrathin Dielectrics", *Applied Physics Letters*, 73(12), (Sep. 21, 1998), pp. 1676-1678.

Burenkov, A., "Corner effect in Double and Triple Gate FinFETs", *European Solid-State Device Research 2003, 33rd Conference on. ESSDERC*, (Sep. 16, 2003), pp. 135-138.

Chang, S. T., et al., "3-D Simulation of Strained S/SiGe heterojunction FinFets", *Semiconductor Device Research Symposium, 2003 International* Dec. 10-12, 2003, Piscataway, NJ, USA, (Dec. 2003), pp. 176-177.

Chang, L., et al., "CMOS Circuit Performance Enhancement by Surface Orientation Optimization", *IEEE Transactions on Electron Devices*, 51(10), (Oct. 2004), pp. 1621-1627.

Chau, Robert, "Advanced Metal Gate/High-K Dielectric Stacks for High-Performance Cmos Transistors", Components Research, Intel Corporation, (2004), 1-3.

Choi, Yang-Kyu, et al., "A Spacer Patterning Technology for Nanoscale CMOS", IEEE, (49)3, XP-001102694, (Mar. 2002), pp. 436-441.

Claflin, B., et al., "Interface Studies of Tungsten Nitride and Titanium Nitride Composite Metal Gate Electrodes With Thin Dielectric Layers", *Journal of Vacuum Science and Technology A 16.3*, (May/Jun. 1998), pp. 1757-1761.

Fried, David M., et al., "High-Performance P-Type Independent-Gate FinFETs", *IEEE Electron Device Letters*, 25(4), (Apr. 2004), pp. 199-201.

Fried, David M., et al., "Improved Independent Gate N-Type FinFET Fabrication and Characterization", *IEEE Electron Device Letters*, 24(9), (Sep. 2003), pp. 592-594.

Guo, Jing, et al., "Performance Projections for Ballistic Carbon Nanotube Field-Effect Transistors", *Applied Physics Letters*, 80(17), (Apr. 29, 2002), pp. 3192-3194.

Hisamoto, Digh, et al, "A Folded-Channel MOSFET for Deepsub-tenth Micron Era", *1998 IEEE International Electron Device Meeting Technical Digest*, (1998), pp. 1032-1034.

Hisamoto, Digh, et al., "A Fully Depleted Lean-Channel Transistor (DELTA)—A Novel Vertifcal Ultrathin SOI MOSFET", *IEEE Electron Device Letters*, IEEE, 11(1), 1990, pp. 36-38

Hisamoto, D., et al., "FinFET—A Self-Aligned Double-Gate MOSFET Scalable to 20 nm", *IEEE Transaction on Electron Devices*, 47(12), (Dec. 2000), pp. 2320-2325.

Huang, et al., "Sub 50 nm FinFET: PMOS", *1999 IEEE International Electron Device Meeting Technical Digest*, (1999), pp. 67-70.

Hwang, Jeong-Mo, et al., "Novel Polysilicon/Tin Stacked-Gate Structure for Fully-Depleted SOI/CMOS", *International Electronic Devices Meeting Technical Digest*, (1992), pp. 345-348.

Ieong, et al., "Three Dimensional CMOS Devices and Integrated Circuits", IEEE CICC, San Jose, CA (Sep. 21-24, 2003), pp. 207-217.

Javey, Ali , et al., "High-k Dielectrics for Advanced Carbon-Nanotube Transistors and Logic Gates", www.nature.com/naturematerials.com, (Nov. 2002), pp. 1-8.

Jin, B. , "Mobility Enhancement in Compressively Strained Sige Surface Channel PMOS Transistors with HFO2/TIN Gate Stack", Componenets Research, Intel Corporation, pp. 1-12.

Jones, E. C., et al., "Doping Challenges in Exploratory Devices for High Performance Logic", 14th Int'l Conference, Piscataway, NJ, (Sep. 22-27, 2002), pp. 1-6.

Kim, Sung M., et al., "A Novel Multi-channel Field Effect Transistor (McFET) on Bulk Si for High Performance Sub 80-nm Application", IEEE, (2004), pp. 639-642.

Kuo, Charles , et al., "A Capacitorless Double Gate DRAM Technology for Sub-100-nm Embedded and Stand-Alone Memory Applications", IEEE 50(12):, (2003), pp. 2408-2416.

Kuo, Charles , et al., "A Capacitorless Double-Gate DRAM Cell Design for High Density Applications", IEEE, (2002), pp. 843-846.

Ludwig, et al., "FinFET Technology for Future Microprocessors", 2003 IEEE Int'l . SOI Conference, New Port Beach, CA, (Sep. 29-Oct. 2, 2003), pp. 33-34.

Martel, Richard , et al., "Carbon Nanotube Field Effect Transistors for Logic Application", IEEE, pp. 7.5.1-7.5.4.

Mayer, T. M., et al., "Chemical Vapor Deposition of Flouroalkylsilane Monolayer Films for Adhesion Control in Microelectromechanical Systems", J. Vac. Sci. Technol. B. 18(5):, (2000), pp. 2433-2440.

Nackaerts, et al., "A 0.314um2 6T-SRAM Cell Build with Tall Triple-Gate Devices for 45nm node applications using 0.75NA 193 nm lithography", *IEDM 2004*, pp. 269-272.

Nowak E. J., et al., "A Functional FinFET-DGCMOS SRAM Cell", Int'l . Electron Devices Meeting, San Francisco, CA (Dec. 8-11, 2002), pp. 411-414.

Nowak, E. J., "Scaling Beyond the 65 nm Node with FinFET-DGCMOS", IEEE CIC, San Jose, CA (Sep. 21-24, 2003), pp. 339-342.

Nowark, Edward J., et al., "Turning Silicon On Its Edge.", *IEEE Circuits & Devices Magazine* vol. 1, (Jan./Feb. 2004), pp. 20-31.

Ohsawa, Takashi , et al., "Memory Design Using a One-Transistor Gain Cell on SOI", *IEEE 37*(11):, (Nov. 2002), pp. 1510-1522.

Park, Donggun, et al., "3-dimensional nano-CMOS Transistors to Overcome Scaling Limits", *IEEE 2004*, ISBN 0-7803-8511-X, pp. 35-40.

Park, T., et al., "Fabrication of Body-Tied FinFETs (Omega MOSFETs) Using Bulk Si Wafers", *2003 Symposium on VLSI Technology Digest of Technical Papers*, (2003), pp. 1-2.

Park, J., "Pi-Gate SOI MOSFET", *IEEE Electron Device Letters*, vol. 22, No. 8, (Aug. 2001), pp. 405-406.

Park, et al., "PMOS Body-Tied FinFET (Omega MOSFET) Characteristics", Device Research Conference, Piscataway, NJ, Jun. 23-25, 2003, IEEE, pp. 33-34.

Park, Jae-Hyoun, et al., "Quantum-Wired MOSFET Photodetector Fabricated by Conventional Photolighography on SOI Substrate", *Nanotechnology, 2004, 4th IEEE Conference* on Munich, Germany, Aug. 16-19, 2004, Piscataway, NJ, pp. 425-427, XP010767302.

Seevinck, Evert , et al., "Static-Noise Analysis of MOS SRAM Cells", IEEE, Journal of Solid-State Circuits, (SC-22)5, (Oct. 1987), pp. 748-754.

Stadele, M. , et al., "A Comprehensive Study of Corner Effects in Tri-gate Transistors", *IEEE 2004*, pp. 165-168.

Stolk, Peter A., et al., "Modeling Statistical Dopant Fluctuations in MOS Transistors", IEEE Transactions on Electron Devices, 45(9), (1997), pp. 153-156.

Subramanian V. , "A Bulk-Si-Compatible Ultrathin-body SOI Technology for Sub-100m MOSFETS", *Proceeding of the 57th Annual Device Research Conference*, (1999), pp. 28-29.

Sugizakai, T. , et al., "Novel Multi-bit SONOS Type Flash Memory Using a High-k Charge Trapping Layer", *VLSI Technology, 2003. Digest of Technical Papers. 2003 Symposium* on Jun. 10-12, 2003., pp. 27-28.

Tanaka, T., et al., "Scalability Study on a Capacitorless IT-DRAM: From Single-gate PD-SOI to Double-gate FinDRAM", IEEE, (2004), pp. 1-4.

U.S. Office Action, "U.S. Appl. No. 10/227,068", (Dec. 18, 2006), pp. 1-25.

U.S. Office Action, "U.S. Appl. No. 10/703,316", (Dec. 15, 2006), pp. 1-22.

Xiong, W., et al., "Corner Effect in Multiple-Gate SOI MOSFETs", IEEE, (2003), 111-113.

Xiong, Weize, et al., "Improvement of FinFET Electrical Characteristics by Hydrogen Annealing", 25(8):, (2004), pp. 541-543.

Yang, Fu-Liang, et al., "5nm-Gate Nanowire FinFET", IEEE, (2004), pp. 196-197.

Choi, Yang-Kyu, et al., "Sub-20nm CMOS FinFET Technologies", IEEE, IEDM 01-421 to 1-424, (2001), pp. 421-424.

* cited by examiner

BLOCK CONTACT ARCHITECTURES FOR NANOSCALE CHANNEL TRANSISTORS

CROSS REFERENCE TO RELATED APPLICATIONS

This application is a divisional of U.S. application Ser. No. 11/173,866, filed Jun. 30, 2005, now U.S. Pat. No. 7,279,375.

BACKGROUND OF THE INVENTION

1. Field of the Invention

The present invention relates to the field of semiconductor integrated circuit manufacturing, and more particularly to contact structures for nanoscale channel devices.

2. Discussion of Related Art

Advances in semiconductor devices and the ongoing quest for miniaturization of the semiconductor devices lead to a demand for better fabrication processes for ever smaller structures because smaller devices typically equate to faster switching times, which lead to increased performance.

In order to achieve this increased device performance, smaller device channel lengths are required and so many non-planar device configurations such as dual-gate, FinFET, tri-gate and omega-gate on both bulk silicon substrates and silicon on insulator (SOI) substrates have been proposed. To fabricate nanoscale transistors having an arbitrarily large drive current, device architecture can include an additional or multiple semiconductor bodies or fingers, creating multiple parallel channels. FIG. 1 is a perspective illustration of a multi-channel tri-gate transistor on silicon on insulator 102. A multi-channel transistor 100 includes a single crystalline silicon substrate 101 having an insulating layer 103, such as a buried oxide formed thereon. On the insulating layer, multiple semiconductor bodies or fingers 105 are formed as shown in FIG. 1. A gate dielectric layer 112 is formed on the multiple semiconductor bodies 105 and a gate electrode 113 formed on the gate dielectric 112, strapping across the multiple semiconductor bodies 105. Source 116 and drain 117 regions are formed in the single crystalline semiconductor layer along laterally opposite sides of gate electrode 113.

For a typical tri-gate device, each semiconductor body 105 has a gate dielectric layer 112 formed on its top surface and sidewalls as shown in FIG. 1. Gate electrode 113 is formed on and adjacent to each gate dielectric 112 on each of the semiconductor bodies 105. Each semiconductor body 105 also includes a source region 116 and a drain region 117 formed in the semiconductor body 105 on opposite sides of gate electrode 113 as shown in FIG. 1. The source regions 116 and drain regions 117 of the semiconductor bodies 105 are electrically coupled together by the semiconductor material used to form semiconductor bodies 105 to form a source landing pad 118 and a drain landing pad 119 as shown in FIG. 1. The source landing pad 118 and drain landing pad 119 are each electrically coupled though metal contact structures 123 to upper levels of interconnect metallization (e.g., metal 1, metal 2, metal 3 . . . ) used to electrically interconnect various transistors 100 together into functional circuits. As shown in FIG. 1, a pair of metal contact structures 123 is provided for each of the semiconductor bodies 105, a first metal contact structure for the source region 116 and a second metal contact for the drain region 117 in order to maintain the parallel circuit architecture of the entire transistor.

With the metal contact architecture shown in FIG. 1, as the pitch of the semiconductor bodies 105 decreases, the pitch 110 of the metal contact structures 123 must also decrease. If the reduction in pitch 110 of the metal contact structures 123 fails to keep pace with the reduction in pitch of the parallel semiconductor bodies, the total resistance of the metal contact structures, the external resistance ($R_{ext}$), becomes a significant contributor to the overall parasitic resistance of the device 100. Thus, the metal contact structures 123 are constrained by the minimum photolithographic pitch of the metal contact structures 123, causing $R_{ext}$ to increase as the pitch of the semiconductor bodies 105 decreases below the minimum photolithographic pitch of the metal contact structures 123.

DETAILED DESCRIPTION OF THE PRESENT INVENTION

Figure 1:
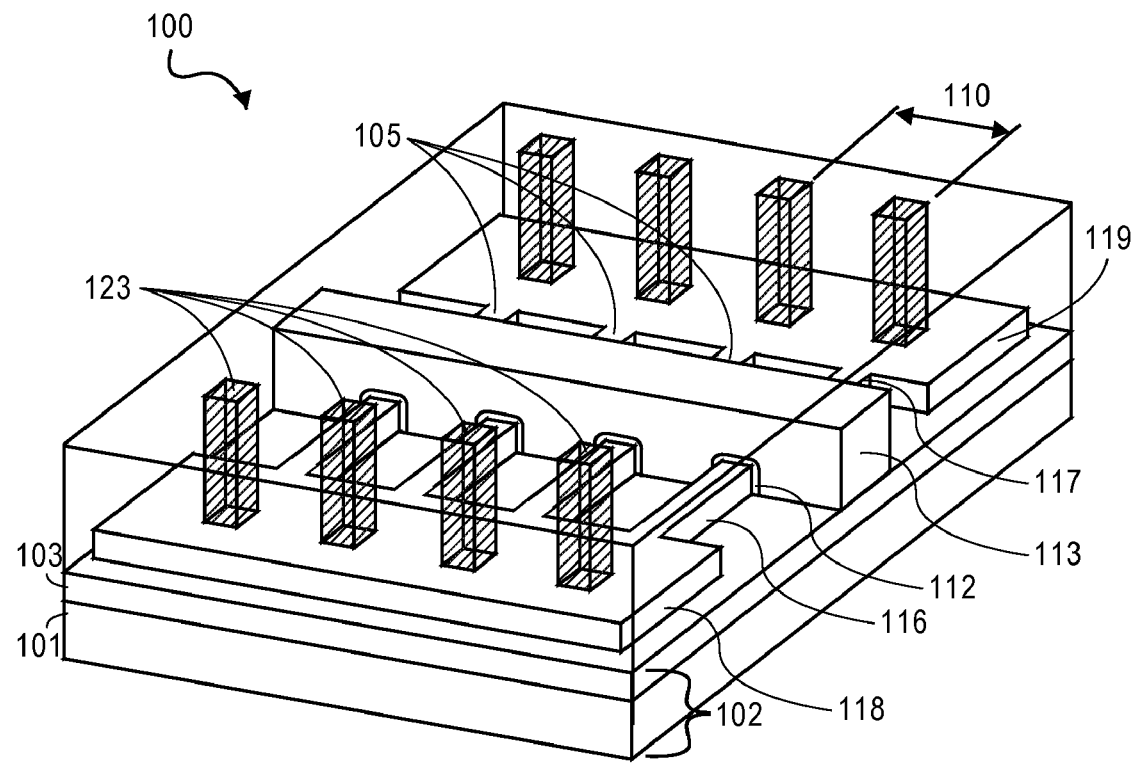
FIG. 1 is an illustration of a perspective view of a conventional multi-channel non-planar transistor.

A novel contact structure for multiple-channel, non-planar transistors and its method of fabrication is described. In the following description numerous specific details are set forth, such as specific materials, dimension and processes, etc. in order to provide a thorough understanding of the present invention. In other instances, well-known semiconductor process and manufacturing techniques have not been described in particular detail in order to not unnecessarily obscure the present invention.

Embodiments of the present invention include device contact architectures where rectangular metal structures contact the source or drain regions of non-planar transistors having a plurality of semiconductor bodies with channels controlled in parallel by a single gate electrode. Embodiments of the present invention include device contact architectures where at least one metal drain contact structure is coupled to and extends between drain regions of the plurality of semiconductor bodies and at least one metal contact structure is coupled to and extends between source regions of the plurality of semiconductor bodies of multi-channel non-planar transistors. Because the rectangular block contact architecture contacts a plurality of semiconductor bodies, the external resistance ($R_{ext}$) of the multi-channel non-planar device is decreased by reducing current crowding at the source and drain ends of the plurality of semiconductor bodies. In this manner the rectangular block architecture increases the transistor switching speed.

Typically, individual transistor devices have provided enough absolute current to drive circuit logic functions. However, as transistor channel widths shrink to nanometer size, the absolute current carried by a single transistor decreases as well. So, while nanometer size devices have improved speed, their absolute current is no longer sufficient to drive an appreciable load, limiting the applications for an individual nanometer transistor. Therefore, it is advantageous for nanoscale devices having nanometer channels to be configured and operated in parallel, enabling a collective of nanoscale devices to operate at the speed of an individual nanometer channel device and provide sufficient absolute current to drive appreciable loads. Nanoscale devices operated in parallel to achieve the necessary drive current require a form factor at least as small as the larger individual transistor device that provides an equivalent amount of absolute current. This requirement is necessary to avoid sacrificing logic-level integration for the improvement in switching speed of the nanometer channel devices and can be described as layout efficiency. Layout efficiency is a ratio of the absolute current carrying width (Z) of a parallel non-planar device layout to that of the typical planar device occupying the same layout width. Because individual non-planar nanoscale transistors increase the effective current carrying width (Z) relative to an individual planar device occupying the same layout width, the layout efficiency of a single non-planar device is significantly greater than 100 percent. However, as previously stated, the dimensional shrink enabled by the non-planar architecture results in a relatively low absolute current, and so many such non-planar devices may be operated in a parallel configuration. Unless the pitch between the parallel non-planar nanoscale transistors is less than the minimum pitch of the planar transistor, the layout width required to delineate individual non-planar devices can decrease the layout efficiency to below 100 percent. Thus, the total current carrying width of the parallel non-planar device will still be lower than that of individual planar devices unless the pitch of the non-planar devices shrinks proportionally with size of the channel. Since, the typical planar transistor has a channel pitch on the order of the minimum lithographic pitch of the metal contact features, it may be necessary to reduce the non-planar nanoscale transistor pitch to sub-lithographic levels by relying on non-lithographic fabrication techniques, such as spacers and self-alignment, to define the individual nanoscale transistor bodies. The use of such techniques can enable layout efficiencies significantly greater than 100 percent for a multiple nanoscale channel device however it is then impossible to delineate or print lithographically an individual source and drain contact structure for each transistor channel as has always been done for the planar transistor having a minimum lithographic pitch. Furthermore, even if the non-planar transistor bodies are printed by conventional lithography it may be impractically expensive or difficult to achieve the critical dimension control required by conventional contact architecture. Unlike the conventional contact architecture, embodiments of the present invention are not constrained by the minimum lithographic pitch, and do not require sharing minimum-sized contact structures between multiple nanoscale transistors. Embodiments of the present invention reduce the current through the metal contact structure and decrease the $R_{ext}$ of the device, increasing device switching speed.

Figure 2A:
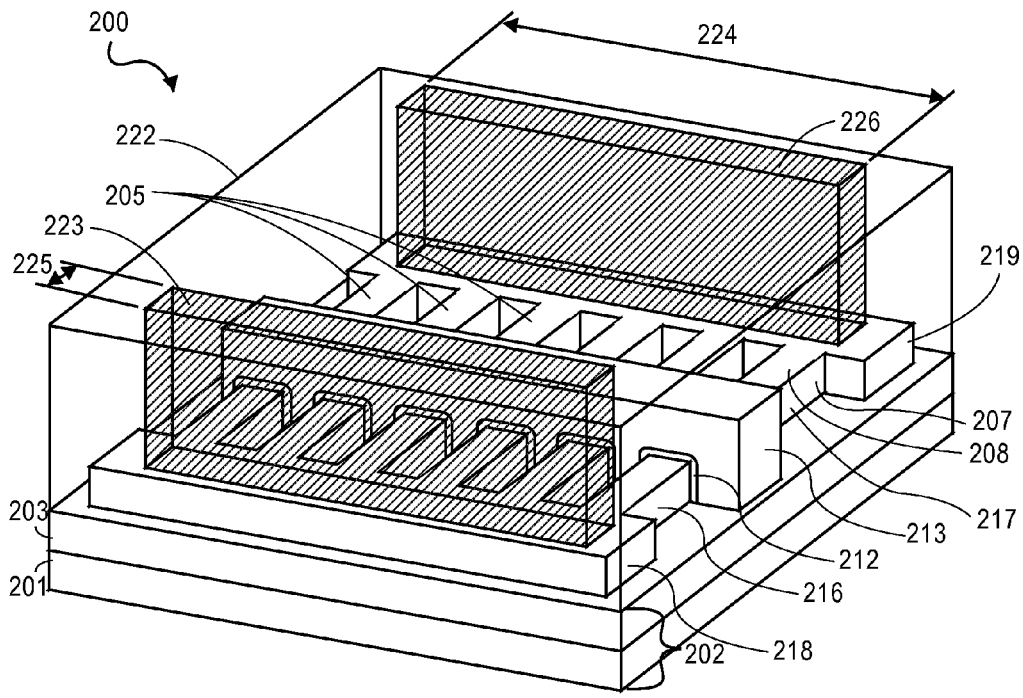
FIG. 2A is an illustration of a perspective view of a multi-channel non-planar transistor having a metal contact architecture in accordance with the present invention.

An example of a multiple-channel non-planar transistor 200 with a metal contact architecture in accordance with an embodiment of the present invention as illustrated in FIG. 2A. Though the non-planar transistor 200 shown in FIG. 2A is a tri-gate device, other non-planar multiple-channel transistor designs such as but not limited to dual-gate, omega-gate, semiconductor nanowire, and carbon nanotube devices are also embodiments of the present invention. Multiple-channel non-planar transistor 200 is formed on a substrate 202. In certain embodiments of the present invention, substrate 202 is an insulating substrate which includes a lower monocrystalline silicon substrate 201 upon which is formed an insulating layer 203, such as a silicon dioxide film. Multiple-channel non-planar transistor 200, however, can be formed on any well-known insulating substrate such as substrates formed from silicon oxide, nitride, carbides, and sapphire. In certain embodiments of the present invention, the substrate 202 can be a "bulk" semiconductor substrate, such as but not limited to monocrystalline silicon substrate and gallium arsenide substrate. A "bulk" semiconductor substrate merely has no insulating layer 203. In an embodiment of the present invention, the substrate 202 is a silicon semiconductor substrate having a doped epitaxial layer with either p-type or n-type conductivity with a concentration level between $1 \times 10^{16} - 1 \times 10^{19}$ atoms/cm$^3$.

In an embodiment of the present invention, multiple-channel non-planar transistor 200 includes a plurality of semiconductor bodies 205 formed on insulator 203 of insulating substrate 202. Although FIG. 2A shows a tri-gate embodiment of the present invention, it should be appreciated that additional embodiments of non-planar transistors are possible such as but not limited to dual-gate, FinFET, omega-gate, carbon nanotube designs. Semiconductor bodies 205 can be formed of any well-known semiconductor material, such as but not limited to silicon (Si), germanium (Ge), silicon germanium ($Si_xGe_y$), gallium arsenide (GaAs), indium antimonide (InSb), gallium phoshide (GaP), gallium antimonide (GaSb), indium phosphide (InP) and carbon nanotubes. Semiconductor bodies 205 can be formed of any well-known material which can be reversibly altered from an insulating state to a conductive state by applying external electrical controls. Semiconductor bodies 205 are ideally a single crystalline film when the best electrical performance of transistor 200, is desired. For example, semiconductor bodies 205 are a single crystalline film when transistor 200 is used in high performance applications, such as in a high density circuit, such as a microprocessor. Semiconductor bodies 205, however, can be a polycrystalline film when transistor 200 is used in applications requiring less stringent performance, such as in liquid crystal displays. In an embodiment of the present invention, insulator 203 insulates semiconductor bodies 205 from monocrystalline silicon substrate 201. In an embodiment of the present invention, semiconductor bodies 205 are a single crystalline silicon film. In an embodiment of the invention where a "bulk" substrate is used, semiconductor bodies 205 are formed from an upper region of the "bulk" semiconductor substrate. Semiconductor bodies 205 have a pair of laterally opposite sidewalls 206 and 207 separated by a distance which defines an individual semiconductor body or finger width. Additionally, semiconductor bodies 205 have a top surface 208 opposite a bottom surface formed on substrate 202. The distance between the top surface 208 and the bottom surface defines an individual semiconductor body height. In an embodiment of the present invention, the individual body height is substantially equal to the individual semiconductor body width. In an embodiment of the present invention, the individual semiconductor body 205 has a width and a height less than 30 nanometers and ideally less than 20 nanometers. In an embodiment of the present invention, the individual semiconductor body height is between half the individual semiconductor body width to twice the individual semiconductor body width. In an embodiment of the present invention, the spacing between two adjacent semiconductor bodies is less than 30 nanometers and ideally less than 20 nanometers. In an embodiment of the present invention, the spacing between two adjacent semiconductor bodies is less than the individual semiconductor body width. In an embodiment of the present invention, the pitch of the semiconductor bodies, the distance between the sidewall 206 of a semiconductor body and the sidewall 206 of an adjacent semiconductor body, is sub-lithographic. In an embodiment of the present invention, the pitch of the semiconductor bodies is less than 110 nm.

Multiple-channel non-planar transistor 200 has a gate dielectric layer 212. Gate dielectric layer 212 is formed on and around three sides of semiconductor body 205 as shown in FIG. 2A. Gate dielectric layer 212 is formed on or adjacent to sidewall 206, on top surface 208 and on or adjacent to sidewall 207 of the semiconductor bodies 205 as shown in FIG. 2A. Gate dielectric layer 212 can be any well-known dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 212 is a silicon oxynitride film formed to a thickness of between 5-20 Å. In an embodiment of the present invention, gate dielectric layer 212 is a high K gate dielectric layer, such as a metal oxide dielectric, such as but not limited to tantalum oxide, titanium oxide, hafnium oxide, zirconium oxide, and aluminum oxide. Gate dielectric layer 212 can be other types of high K dielectric, such as but not limited to lead zirconium titanate (PZT).

Multiple-channel non-planar transistor 200 has a gate electrode 213 as shown in FIG. 2A. Gate electrode 213 is formed on and around gate dielectric layer 212 as shown in FIG. 2A. Gate electrode 213 is formed on or adjacent to gate dielectric 212 formed on sidewall 206 of each of the semiconductor bodies 205, is formed on gate dielectric 212 formed on the top surface 208 of each of the semiconductor bodies 205, and is formed adjacent to or on gate dielectric layer 212 formed on sidewall 207 of each of the semiconductor bodies 205. Gate electrode 213 has a pair of laterally opposite sidewalls separated by a distance which defines the gate length ($L_g$) of transistor 200. In an embodiment of the present invention, the laterally opposite sidewalls of the gate electrode 213 run in a direction perpendicular to the laterally opposite sidewalls 206 and 207 of the semiconductor bodies 205.

Gate electrode 213 can be formed of any suitable gate electrode material. In an embodiment of the present invention, the gate electrode 213 comprises polycrystalline silicon doped to a concentration density between $1\times10^{19}$ atoms/$cm^3$ and $1\times10^{20}$ atoms/$cm^3$. In an embodiment of the present invention, the gate electrode can be a metal gate electrode such as but not limited to tungsten, tantalum, titanium, nickel, cobalt, aluminum, and corresponding nitrides and silicides. In an embodiment of the present invention, the gate is formed from a carbon nanotube. In an embodiment of the present invention, the gate electrode is formed from a material having a mid-gap work function between 4.6-4.9 eV. It is to be appreciated, the gate electrode 213 need not necessarily be a single material and can be a composite stack of thin films such as but not limited to a polycrystalline silicon/metal electrode or a metal/polycrystalline silicon electrode.

Multiple-channel non-planar transistor 200, as shown in FIG. 2A, has source regions 216 and drain regions 217 of the semiconductor bodies 205. Source regions 216 and drain regions 217 are formed in the semiconductor bodies 205 on opposite sides of gate electrode 213 as shown in FIG. 2A. The source region 216 and the drain region 217 are formed of the same conductivity type such as n-type or p-type conductivity. In an embodiment of the present invention, source region 216 and drain region 217 have a doping concentration of $1\times10^{19}$ - $1\times10^{21}$ atoms/$cm^3$. Source region 216 and drain region 217 can be formed of uniform concentration or can include sub-regions of different concentrations or doping profiles such as tip regions (e.g., source/drain extensions).

In an embodiment of the present invention, source region 216 and drain region 217 can include a silicon or other semiconductor film formed on and around semiconductor bodies 205. For example, semiconductor film can be a silicon film or a silicon alloy such as silicon germanium ($Si_xGe_y$) to form "raised" source and drain regions. In an embodiment of the present invention, a silicide film, such as, but not limited to, titanium silicide, nickel silicide, and cobalt silicide is formed on the source region 216 and drain region 217. In an embodiment of the present invention, silicide film is formed directly on the top surface 208 of the semiconductor bodies 205. In an embodiment of the present invention, the source regions 216 and drain regions 217 are fully silicided (FUSI).

In an embodiment of the present invention, the source regions 216 and drain regions 217 of the semiconductor bodies 205 are electrically coupled together by the material used to form semiconductor bodies 205 to form a common source rail or landing pad 218 and a common drain rail or landing pad 219 as shown in FIG. 2A. In an alternate embodiment the source regions 216 and drain regions 217 of each of the semiconductor bodies 205 remain electrically isolated from each other and no common source or drain landing pad is formed.

The portion of semiconductor body 205 located between source region 216 and drain region 217, defines one channel region of the multiple-channel non-planar transistor 200 and is surrounded by the gate electrode 213. In an embodiment of the present invention, channel region is intrinsic or undoped monocrystalline silicon. In an embodiment of the present invention, channel region is doped monocrystalline silicon. When channel region is doped it is typically doped to a conductivity level of between $1\times10^{16}$ to $1\times10^{19}$ atoms/$cm^3$. In an embodiment of the present invention, when the channel region is doped it is typically doped to the opposite conductivity type of the source region 216 and the drain region 217. For example, when the source and drain regions are n-type conductivity the channel region would be doped to p-type conductivity. Similarly, when the source and drain regions are p-type conductivity the channel region would be n-type conductivity. In this manner a multiple-channel non-planar transistor 200 can be formed into either an NMOS transistor or a PMOS transistor respectively.

Multiple-channel non-planar transistor 200 is encapsulated in an insulating media, or interlayer dielectric (ILD) 222 as shown in FIG. 2A. In an embodiment of the present invention, the ILD is a material having a low dielectric constant, such as a film with high porosity or a film of carbon-doped oxide. In an embodiment of the present invention, the ILD is formed from PSG, BPSG, silicon dioxide, silicon nitride, or a composite of these or other commonly known materials.

Multiple-channel non-planar transistor 200, as shown in FIG. 2A, is electrically coupled to external devices through the ILD 222 with rectangular block contact structures 223 and 226. Contact structures may be of any commonly known conductive material, such as but not limited to aluminum, gold, titanium, tungsten, silver, and carbon nanotubes. In an embodiment of the present invention, the metal contact structures 223 and 226 are copper. In an embodiment of the present invention, the metal contact structures 223 and 226 have additional barrier layers such as but not limited to tantalum, tantalum nitride, titanium, and titanium nitride.

It is to be appreciated that the rectangular block contact structures, 223 and 226 may be dimensioned independently of each other. It should also be appreciated that an architecture describing one block contact structure, such as the source contact structure 223, may be independently applied to the architecture of the drain contact structure 226. Therefore, the structures described in various embodiments or shown in FIGS. 2A-2D can be utilized for either the source or drain contact in any combination.

In an embodiment of the present invention, as shown in FIG. 2A, one metal source contact structure 223 contacts the source regions 216 and one metal drain contact structure 226 contacts the drain regions 217 of the multiple semiconductor bodies 205. In an embodiment of the present invention, the metal source contact structure 223 has a width 224 approximately equal to the number of semiconductor bodies 205 multiplied by the pitch of the semiconductor bodies 205 of the transistor and a length 225 approximately equal to the minimum photolithographic feature size. In an embodiment of the present invention, the metal drain contact structure 226 has a width approximately equal to the number of semiconductor bodies 205 multiplied by the pitch of the semiconductor bodies 205 of the transistor and a length approximately equal to the minimum photolithographic feature size. In a further embodiment of the present invention the source contact structure 223 has a width 224 substantially greater than the length 225 while the drain contact structure 226 has a width about equal to the minimum lithographic dimension. Similarly, drain contact structure 226 may also be so dimensioned to be a block contact having the width substantially greater than the length while the source contact structure has minimum lithographic dimensions. In embodiments of the invention, the length 225 of the contact structure 223 may be larger than the minimum lithographic dimension, allowing for misalignment tolerances.

In an embodiment of the present invention, the source contact structure 223 makes contact to the common source rail or landing pad 218, as shown in FIG. 2A. In an embodiment of the present invention, the metal drain contact 226 makes contact to the common drain rail or landing pad 219 of the multiple-channel non-planar transistor 200.

By dimensioning single contact structures in the manners stated, the minimum pitch of the lithography used to define the location of the metal block contact structures no longer constrains device design even when the minimum pitch of the semiconductor bodies 205 is sub-lithographic. Furthermore, as the metal block contact structure width, 224 becomes significantly greater than the length 225, the block contact structure 223 begins to approximate a one-dimensional slot. Such a one-dimensional slot can have a lithographically defined length 225 that is smaller than the length of a contact structure which is two-dimensional (having a width 224 approximately equal to a length 225) because of the improved resolution of one-dimensional imaging.

Figure 2B:
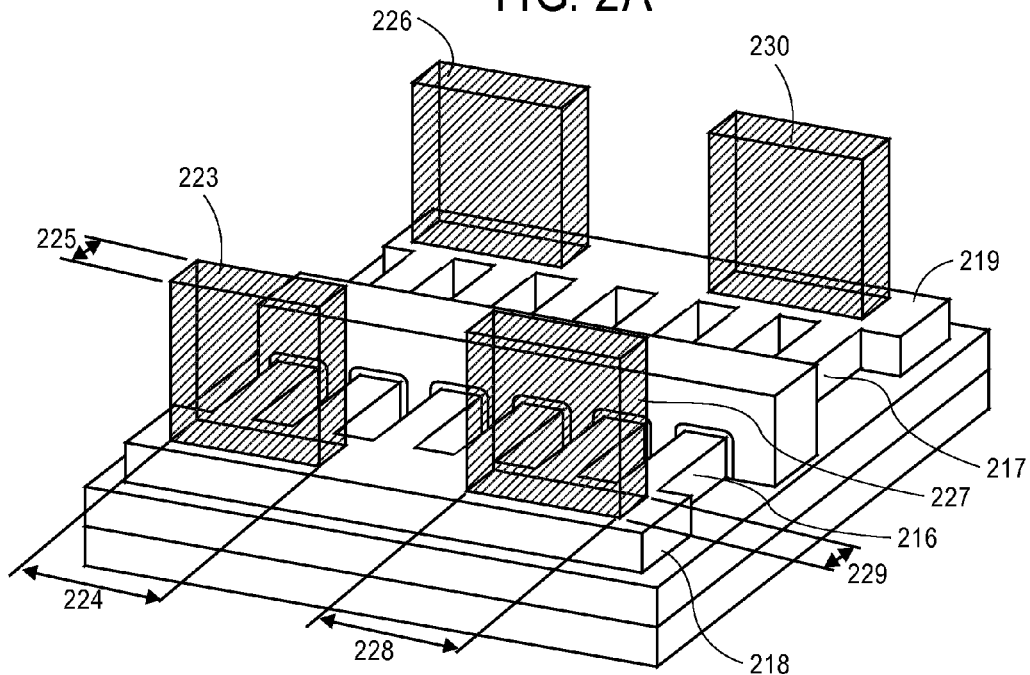
FIG. 2B is an illustration of a perspective view of a multi-channel non-planar transistor having a metal contact architecture in accordance with the present invention.

In an embodiment of the present invention, as shown in FIG. 2B, multiple source contact structures 223 and 227 contact the common source landing pad 218 and multiple drain contact structures 226 and 230 contact the common drain landing pad, 219. In a further embodiment of the present invention the source contact structures contact the plurality of source regions without a common source landing pad and the drain contact structures contact the plurality of drain regions without a common drain landing pad. In an embodiment of the present invention, the block contact structures have a width 224 substantially greater than a length 225, as shown in FIG. 2B. In an embodiment of the present invention, contact structure 223 has a width 224 that differs from the width 228 of contact structure 227. In an embodiment of the present invention, contact structure 223 has a length 225 that differs from the length 229 of contact structure 227.

Figure 2C:
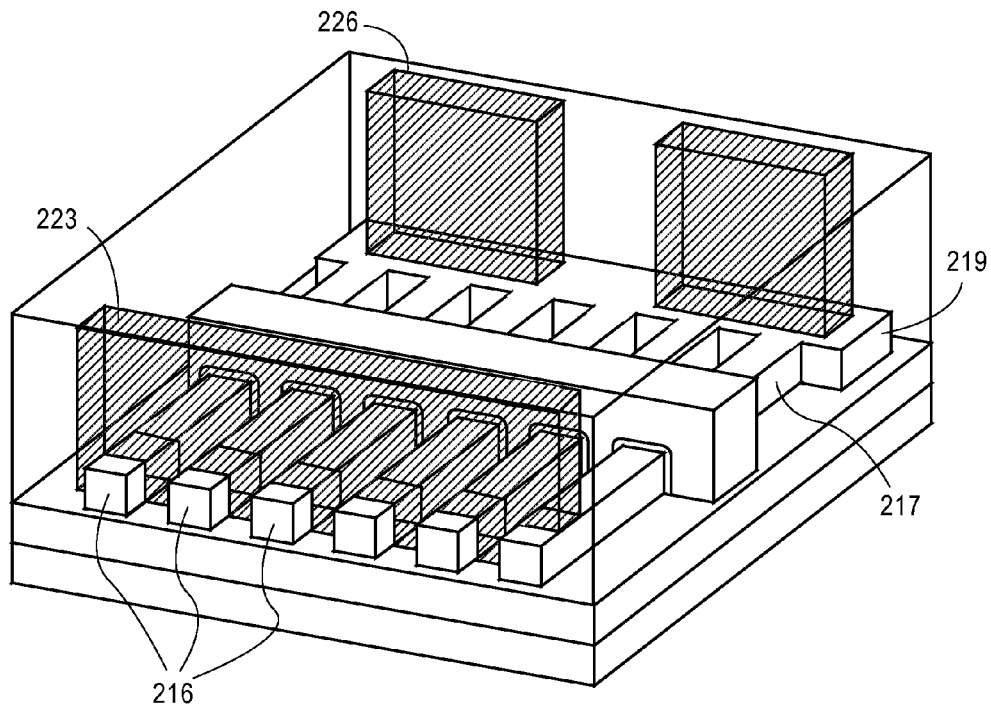
FIG. 2C is an illustration of a perspective view of a multi-channel non-planar transistor having a metal contact architecture in accordance with the present invention.

In an embodiment of the present invention, a single metal source contact structure 223 makes contact directly to the plurality of source regions 216 in a self-aligned fashion without a common source landing pad, while drain contacts structure 226 makes contact to the drain regions 217 by means of drain landing pad 219, as shown in FIG. 2C. In a similar fashion, metal drain contact structures make contact directly to the plurality of drain regions without a common drain landing pad. In this manner the effective surface area of the metal contact structure is increased by the step height of the non-planar device because the metal contact structure wraps around the non-planar source regions 216 and the non-planar drain regions 217. Much like the non-planar transistor has an increased the channel width, the non-planar contact will have an increased contact width relative to a linear contact, thereby lowering the contact resistance and lowering the total parasitic resistance of the parallel device.

Figure 2D:
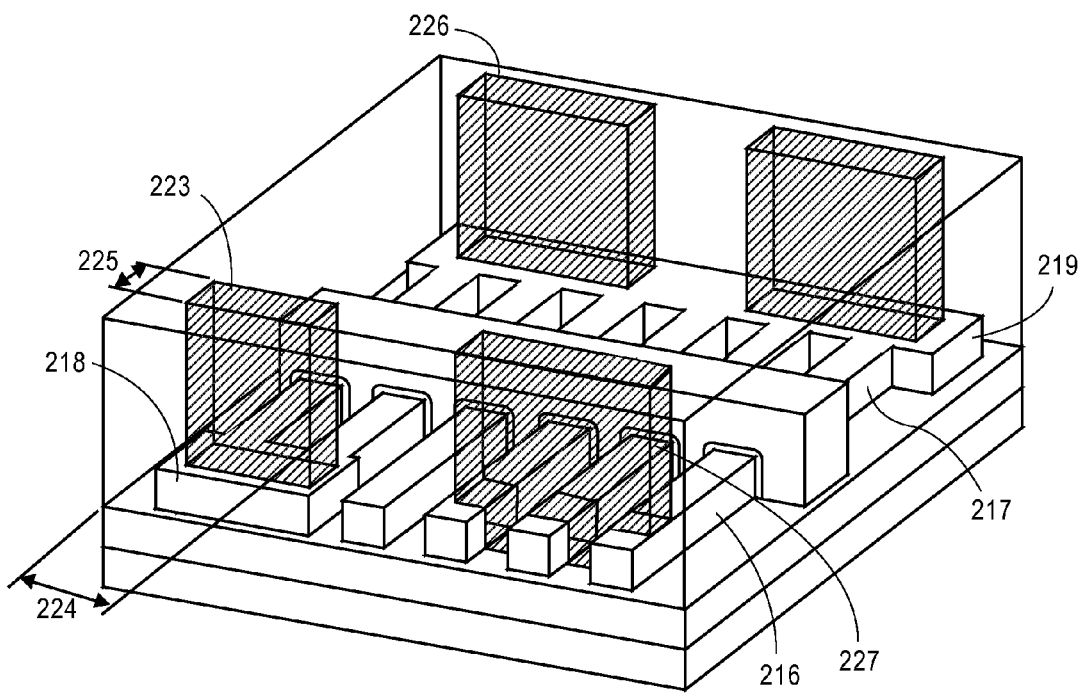
FIG. 2D is an illustration of a perspective view of a multi-channel non-planar transistor having a metal contact architecture in accordance with the present invention.

In certain embodiments of the present invention, multiple-channel non-planar transistor, as shown in FIG. 2D, is electrically coupled to external devices using multiple metal source contact structures 223 and 227 contacting the source regions 216 or source landing pad 218. In a further embodiment of the present invention multiple metal drain contact structures contact the drain regions 217 in a similar fashion. In an embodiment of the present invention, at least one of the metal source contact structures 223 and 227 has a width 224 greater than the pitch of the semiconductor bodies but less than the number of semiconductor bodies multiplied by the pitch of the semiconductor bodies and a length 225 on the order of the minimum lithographic feature size. In other embodiments of the present invention, at least one of the metal drain contact structures 226 have a width greater than the pitch of the semiconductor bodies but less than the number of semiconductor bodies multiplied by the pitch of the semiconductor bodies and a length about the minimum lithographic feature size and contact the drain regions 217 or landing pad 219.

In an embodiment of the present invention, multiple source contact structures 223 and 227 contact the source regions 216 and a single metal drain contact structure 226 contacts the drain regions 217 or the landing pad 219, as shown in FIG. 2D. In certain embodiments of the present invention, a single metal source contact structure contacts the source regions while multiple drain contact structures contact the drain regions of the semiconductor bodies. In an embodiment of the present invention, the single source contact structure contacts the common source landing pad while the multiple drain contact structures contact a plurality of drain regions. In this manner it is possible to perform basic fan-out, adder, or other logic operations within a parallel device and take advantage of the superior layout efficiency afforded by utilizing transistors having a sub-lithographic pitch, as previously stated. As the semiconductor bodies have sub-lithographic pitch, not all semiconductor bodies will necessarily be contacted by the contact structures 223 and 227 in this embodiment of the invention. However, because the semiconductor bodies are operating in parallel a failure to contact some of the semiconductor bodies will not necessarily be detrimental to the operation of the overall device if sufficient drive current is achieved by the semiconductor bodies which are contacted by structures 223 and 227.

Figure 3A:
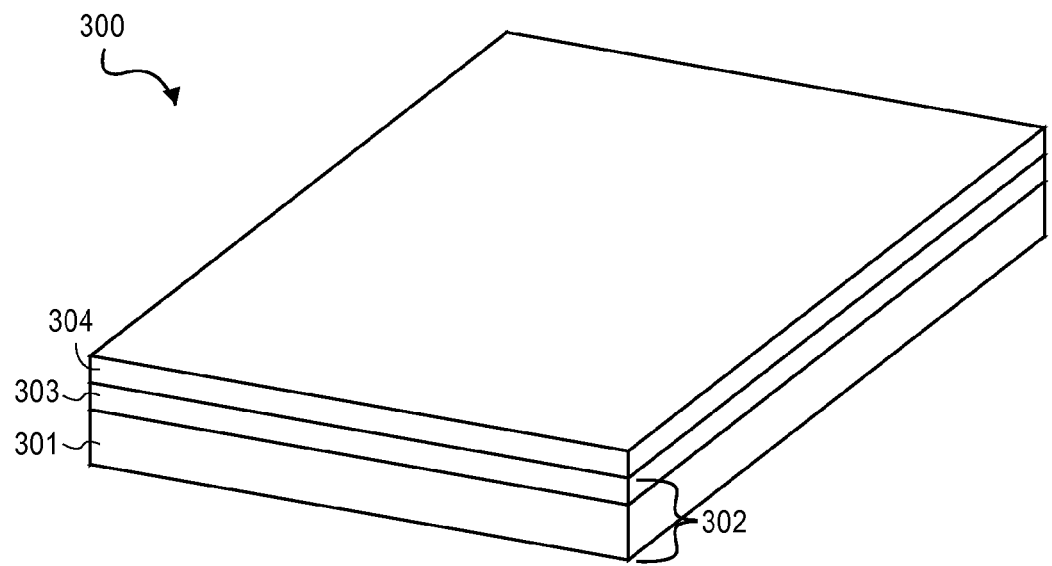
FIG. 3A-3L are illustrations of perspective and cross sectional views of a method of fabricating a multi-channel non-planar transistor having a contact architecture in accordance with the present invention.
Figure 3B:
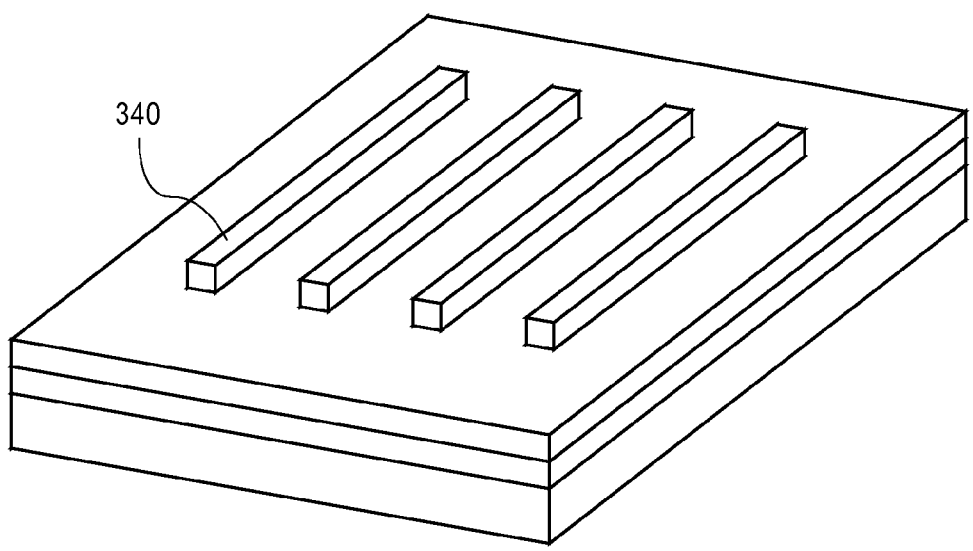
Figure 3C:
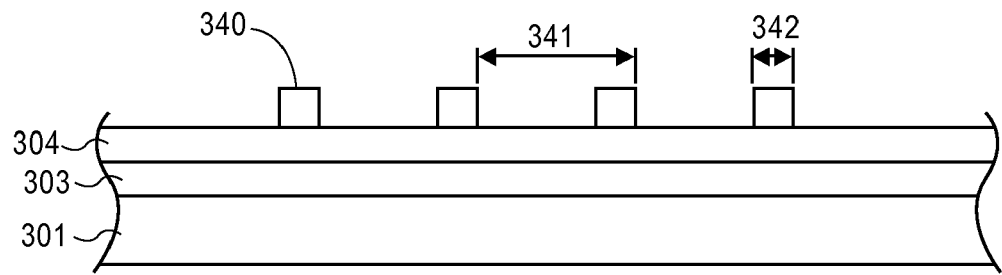

A method of fabricating a tri-gate transistor in accordance with an embodiment of the present invention is illustrated in FIGS. 3A-3L. The fabrication of a non-planar transistor begins with substrate 302. A silicon or semiconductor film 304 is formed on substrate 302 as shown in FIG. 3A. In an embodiment of the present invention, the substrate 302 is an insulating substrate, such as shown in FIG. 3A. In an embodiment of the present invention, insulating substrate 302 includes a lower monocrystalline silicon substrate 301 and an insulating layer 303, such as a silicon dioxide film or silicon nitride film. Insulating layer 303 isolates semiconductor film 304 from substrate 302, and in embodiment is formed to a thickness between 200-2000 Å. Insulating layer 303 is sometimes referred to as a "buried oxide" layer. When a silicon or semiconductor film 304 is formed on an insulating substrate 301, a silicon or semiconductor on insulating (SOI) substrate 300 is created. In other embodiments of the present invention, the substrate 302 can be a "bulk" semiconductor substrate, such as but not limited to a silicon monocrystalline substrate and a gallium arsenide substrate. In an embodiment of the invention where a "bulk" substrate is used, semiconductor layer 304 is merely an upper region of the semiconductor substrate. Therefore, it should be understood that embodiments relating to semiconductor film 304 are also applicable to "bulk" device embodiments utilizing "bulk" substrates. In certain embodiments of the present invention, the substrate 302 is a silicon semiconductor substrate having a doped epitaxial layer with either p-type or n-type conductivity with a concentration level between $1\times10^{16}$-$1\times10^{19}$ atoms/cm$^3$.

Although semiconductor film 304 is ideally a silicon film, in other embodiments it can be other types of semiconductor films, such as but not limited to germanium (Ge), a silicon germanium alloy ($Si_xGe_y$), gallium arsenide (GaAs), InSb, GaP, GaSb, InP as well as carbon nanotubes. In an embodiment of the present invention, semiconductor film 304 is an intrinsic (i.e., undoped) silicon film. In other embodiments, semiconductor film 304 is doped to p-type or n-type conductivity with a concentration level between $1\times10^{16}$-$1\times10^{19}$ atoms/cm$^3$. Semiconductor film 304 can be insitu doped (i.e., doped while it is deposited) or doped after it is formed on substrate 302 by for example ion-implantation. Doping after formation enables both PMOS and NMOS tri-gate devices to be fabricated easily on the same insulating substrate. The doping level of the semiconductor body at this point can determine the doping level of the channel region of the device.

In certain embodiments of the present invention, semiconductor film 304 is formed to a thickness which is approximately equal to the height desired for the subsequently formed semiconductor body or bodies of the fabricated tri-gate transistor. In an embodiment of the present invention, semiconductor film 304 has a thickness or height of less than 30 nanometers and ideally less than 20 nanometers. In another embodiment of the present invention, semiconductor film 304 is formed to the thickness approximately equal to one-third of the gate "length" desired of the fabricated tri-gate transistor. In an embodiment of the present invention, semiconductor film 304 is formed thicker than desired gate length of the device. In certain embodiments of the present invention, semiconductor film 304 is formed to a thickness which will enable the fabricated tri-gate transistor to be operated in a fully depleted manner for its designed gate length (Lg).

Semiconductor film 304 can be formed on insulating substrate 302 in any well-known method. In one method of forming a silicon on insulator substrate, known as the separation by implantation of oxygen (SIMOX) technique. Another technique currently used to form SOI substrates is an epitaxial silicon film transfer technique which is generally referred to as bonded SOI. In certain embodiments of the present invention, semiconductor film 304 is a portion of the "bulk" semiconductor substrate.

At this time, if desired, isolation regions (not shown) can be formed into substrate 300 in order to isolate the various transistors to be formed therein from one another. Isolation regions can be formed by etching away portions of the semiconductor film 304 surrounding a tri-gate transistor, by for example well-known photolithographic and etching techniques. If desired, back filling the etched regions with an insulating film, such as $SiO_2$ can be performed.

At this time, semiconductor bodies can be formed from semiconductor film 304 using commonly known photolithography and subtractive etch techniques to define semiconductor bodies. In certain embodiments of the present invention, semiconductor bodies have lithographic size and pitch. In certain embodiments of the present invention, sub-lithographic fabrication techniques such as spacers can be utilized to form semiconductor bodies having sub-lithographic pitch, as shown in FIGS. 3B-3F. In one method, a first mask layer is formed from a commonly known dielectric or metallic material. In an embodiment of the present invention, the first mask layer is a nitride. In an embodiment of the present invention, the first mask layer is an oxide. In another embodiment of the present invention, the first mask layer is polycrystalline silicon. As shown from a perspective view in FIG. 3B, the first mask layer can be defined into a pattern of mandrel structures 340 through the use of commonly known photolithography and etching processes. The mandrel structures 340 are shown in cross-sectional view in FIG. 3C. The mandrels 340 have a height, width, and pitch sufficient for a subsequently formed spacer to have a predetermined pitch and width. In certain embodiments of the present invention, the mandrel structures can be given the minimum lithographic pitch 341 and width 342 resolvable by the particular photolithographic equipment used. In an embodiment of the present invention, the mandrel structures are patterned with 193 nm lithography. In an embodiment of the present invention, the mandrel structures have a pitch 341 of approximately 110 nm. In an embodiment of the present invention, the photodefined layer used to define the mandrel 340 is further reduced in dimension by commonly known techniques such as but not limited to isotropically etching with a dry develop or wet etch process. In a further embodiment of the present invention, mandrel structures 340 are reduced in dimension after patterning by an isotropic etch process.

Figure 3D:
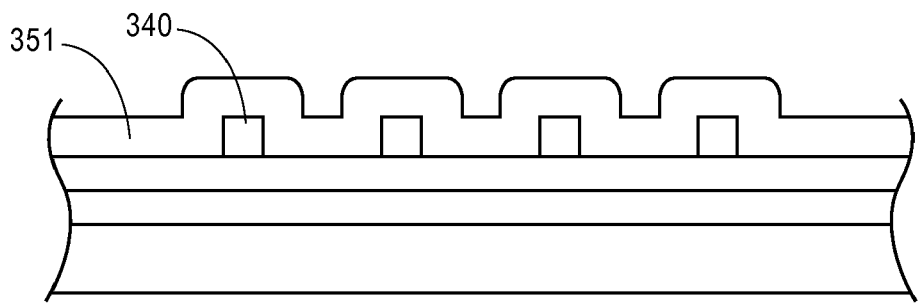

In certain embodiments of the present invention, a second mask layer 351 is formed over the mandrel structures, as shown in FIG. 3D. The second mask material is of a type commonly known to be suited to forming a spacer having a property enabling it to withstand the method used to subsequently remove the mandrel. The thickness of the second mask material is selected so as to enable the subsequent formation of a spacer having a predetermined width. In an embodiment of the present invention, the second mask layer 351 can be a commonly known material such as but not limited to a nitride, an oxide, or polycrystalline silicon. The second mask layer 351 can be a commonly known metallic material. Commonly known techniques to deposit second mask layer 351 can be used to achieve the desired step coverage or conformality needed, such as but not limited to chemical vapor deposition (CVD), plasma enhanced CVD (PECVD), high density plasma (HDP), or atomic layer deposition (ALD).

Figure 3E:
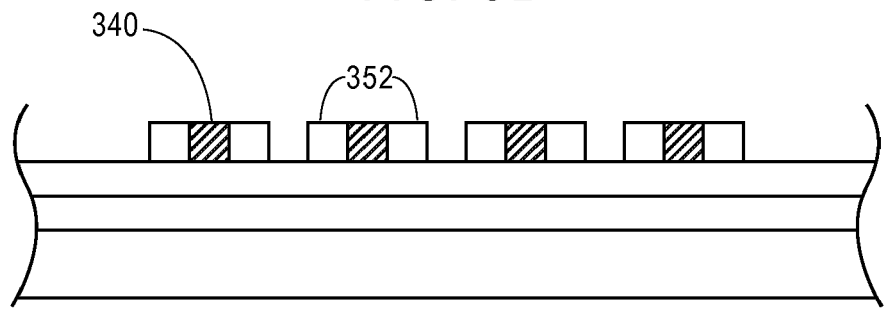
Figure 3F:
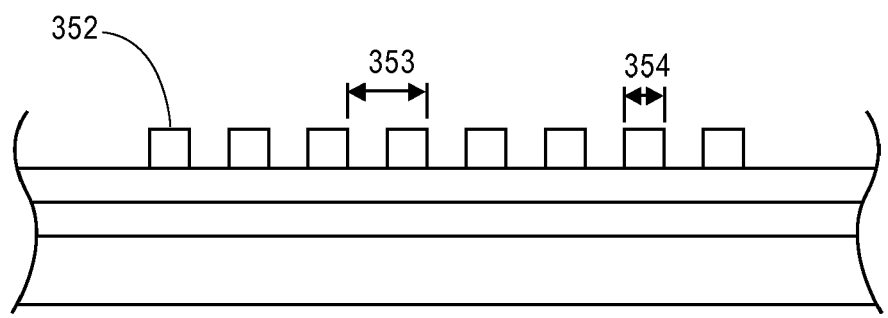

As shown in FIG. 3E, the second mask material can be formed into spacers 352 adjacent to the sidewalls of the mandrels 340 using any commonly known anisotropic etching technique suitable for the second mask material.

At this point the mandrels can be removed by any etching technique which selectively removes the mandrels without substantially altering spacers 352. In an embodiment of the present invention, the mandrels are etched away using a commonly known wet chemical etch processes. In another embodiment of the present invention, the mandrels are removed in commonly known plasma etch processes. Once the mandrels have been removed, spacer structures 352 having a predetermined pitch 353 and width 354 remain, as shown in a cross-sectional view in FIG. 3F. In an embodiment of the present invention, the pitch 353 of the spacer structures 352 is sub-lithographic. In an embodiment of the present invention, the spacer structure pitch 353 is about half of the pitch of the mandrel structures. In an embodiment of the present invention, the spacer structures 352 have a pitch on the order of 55 nm. As shown in perspective view in FIG. 3G, the spacer structures 352 form a pattern or plurality of patterns defining locations where semiconductor bodies or fins will be subsequently formed in the semiconductor film 304. The spacer 352 pattern defines the width 354 desired of the subsequently formed semiconductor bodies or fins of the tri-gate transistor. In an embodiment of the present invention, the spacer structures 352 will have a width 353 less than or equal to 30 nanometers and ideally less than or equal to 20 nanometers. As can be appreciated by one of ordinary skill in the art, the process of forming the spacer structures 352 could be iterated, each time doubling the number of spacer structures 352 while potentially reducing the spacer pitch 353 and spacer width 354.

Figure 3G:
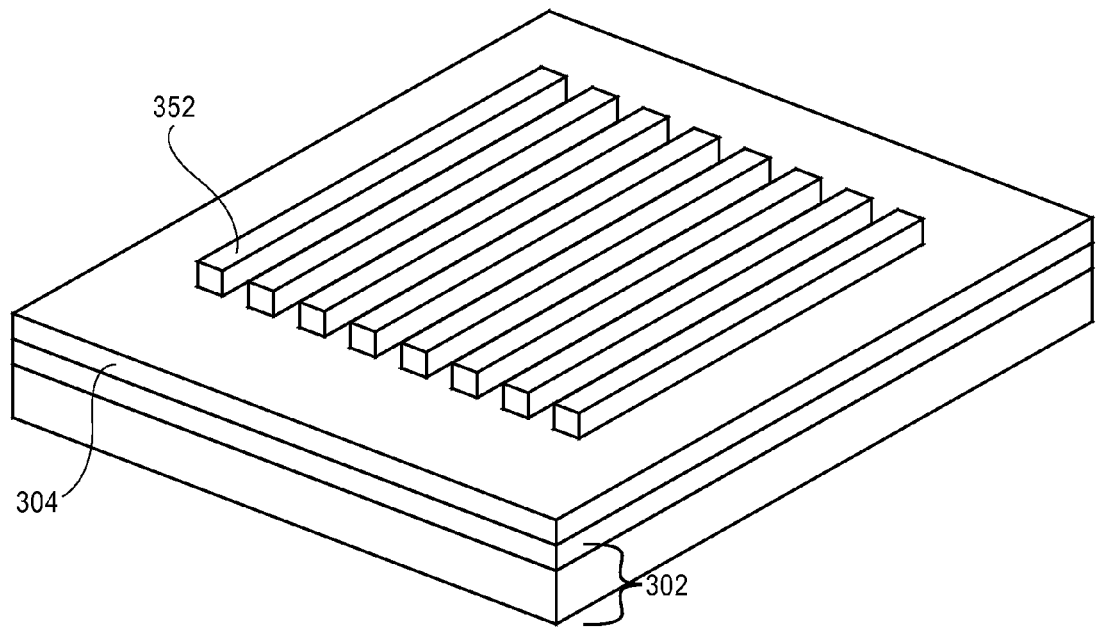
Figure 3H:
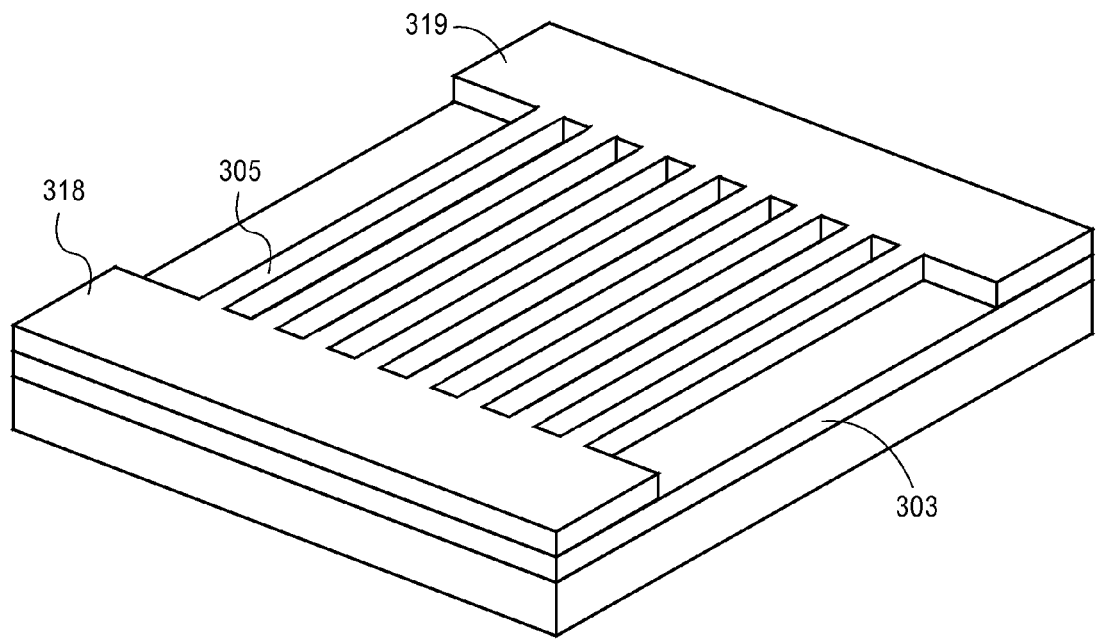

At this time, if desired, a photo definable mask (not shown) can be used to augment the spacer structures 352, selectively protecting areas of the semiconductor film 304 which are not already protected by the spacer structures 352 in order to form a tri-gate transistor on substrate 300. The photoresist mask can also define source landing pads and drain landing pads. The landing pads can be used to connect together the various source regions and to connect together the various drain regions of the fabricated transistor. In certain embodiments of the present invention, the photoresist mask is further used to define other semiconductor bodies having lithographic pitch. The photoresist mask can be formed by well-known photolithographic techniques including masking, exposing, and developing a blanket deposited photoresist film. After forming photoresist mask, semiconductor film 305 is etched in alignment with photoresist mask and spacer structures 352 to form one or more silicon bodies or fins and source or drain landing pads, 318 and 319 respectively, as shown in FIG. 3H. In certain embodiments of the present invention, semiconductor film 304 in FIG. 3G is etched until the underlying buried oxide layer 303 is exposed. In embodiments of the present invention where a "bulk" substrate is used, semiconductor film 304 is etched to a desired depth. Well-known semiconductor etching techniques, such as anisotropic plasma etching or reactive ion etching can be used to define semiconductor bodies 305 as shown in FIG. 3H. At this time, spacer structures 352 and photo resist can be removed with commonly known techniques. At this point, embodiments where semiconductor bodies 305 have lithographic pitch as well as embodiments where semiconductor bodies 305 have sub-lithographic pitch can be both be represented by FIG. 3H.

Figure 3I:
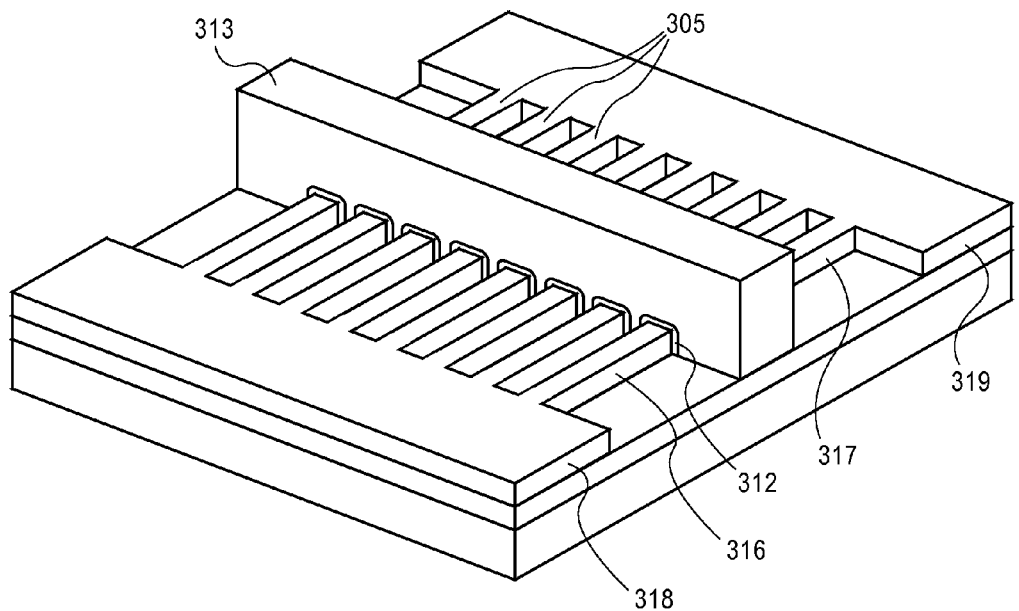

Next, a gate dielectric layer, as shown in FIG. 3I is formed on each semiconductor body 305 in a manner dependent on the type of non-planar device (dual-gate, tri-gate, omega-gate, carbon nanotube). In an embodiment of the present invention, a gate dielectric layer 312 is formed on the top surface of each of the semiconductor bodies 305 as well as on the laterally opposite sidewalls of each of the semiconductor bodies 305. The gate dielectric can be a deposited dielectric or a grown dielectric. In an embodiment of the present invention, the gate dielectric layer 312 is a silicon dioxide dielectric film grown with a dry/wet oxidation process. In an embodiment of the present invention, the silicon oxide film is grown to a thickness of between 5-15 Å.. In an embodiment of the present invention, the gate dielectric film 312 is a deposited dielectric, such as but not limited to a high dielectric constant film, such as metal oxide dielectric, such as tantalum pentaoxide, titanium oxide, hafnium oxide, zirconium oxide, aluminum oxide, or other high-K dielectrics, such as barium strontium titanate (BST). A high dielectric constant film can be formed by well-known techniques, such as by chemical vapor deposition (CVD) and atomic layer deposition (ALD). In an embodiment of the present invention, the gate dielectric can be comprised of a composite of such films.

Next, as shown in FIG. 3I, a gate electrode 313 is formed. The gate electrode 313 is formed on the gate dielectric layer 312 formed on the top surface of each of the semiconductor bodies 305 and is formed on or adjacent to the gate dielectric 312 formed on or adjacent to the sidewalls of each of the semiconductor bodies 305 as shown in FIG. 3I. The gate electrode can be formed to a thickness between 200-3000 Å.. In an embodiment the gate electrode has a thickness of at least three times the height of the semiconductor bodies 305. In embodiment of the present invention, the gate electrode material comprises polycrystalline silicon. In another embodiment of the present invention, the gate electrode material comprises a polycrystalline silicon germanium alloy. In yet other embodiments of the present invention, the gate electrode material can comprise a metal film, such as nickel, cobalt, tungsten, titanium, tantalum, aluminum, and their nitrides and silicides. In a further embodiment of the present invention the gate electrode can be a carbon nanotube. Gate electrode 313 can be formed by well-known techniques, such as by blanket depositing a gate electrode material over the substrate of and then patterning the gate electrode material with well-known photolithography and etching techniques. In certain embodiments of the present invention, the photolithography process used to define gate electrode 313 utilizes the minimum or smallest dimension lithography process used to fabricate the non-planar transistor. In an embodiment of the present invention, a mandrel-type process similar to the one described for defining the semiconductor bodies 305 or commonly known oxidation techniques can be used to form a gate electrode 313 having sub-lithographic dimensions. In other embodiments of the present invention "replacement gate" methods are used to form the gate electrode 313.

Next, source regions 316 and drain regions 317 for the transistor are formed in semiconductor body 305 on opposite sides of gate electrode 313, as shown in FIG. 3I. In an embodiment of the present invention, the source and drain regions include tip or source/drain extension regions which can be formed by placing dopants into semiconductor bodies of gate electrode. If source and drain landing pads 318 and 319 are utilized, they may be doped at this time also. For a PMOS tri-gate transistor, the semiconductor fins or bodies 305 are doped to p-type conductivity and to a concentration between $1 \times 10^{20}$-$1 \times 10^{21}$ atoms/cm$^3$. For a NMOS tri-gate transistor, the semiconductor fins or bodies 305 are doped with n-type conductivity ions to a concentration between $1 \times 10^{20}$-$1 \times 10^{21}$ atoms/cm$^3$. In an embodiment of the present invention, the silicon films are doped by ion-implantation. In a further embodiment of the present invention, the ion-implantation occurs in a vertical direction. When gate electrode 313 is a polysilicon gate electrode, it can be doped during the ion-implantation process. Gate electrode 313 acts as a mask to prevent the ion-implantation step from doping the channel region(s) of the tri-gate transistor. The channel region is the portion of the silicon body 305 located beneath or surrounded by the gate electrode 313. If gate electrode 313 is a metal electrode, a dielectric hard mask maybe used to block the doping during the ion-implantation process. In other embodiments, other methods, such as solid source diffusion, may be used to dope the semiconductor body to form source and drain extensions. In embodiments of the present invention, "halo" regions can be formed in silicon body prior to the formation of a source/drain regions or source/drain extension regions.

Next, if desired, the substrate can be further processed to form additional features, such as heavily doped source/drain contact regions, deposited silicon or silicon germanium on the source and drain regions as well as the gate electrode, and the formation of silicide on the source/drain contact regions as well as on the gate electrode. In embodiments of the present invention, dielectric sidewall spacers can be formed on the sidewalls of the gate electrode. Sidewall spacers can be utilized to offset heavy source/drain contact implants, can be used to isolate source/drain regions from the gate electrode during a selective silicon or silicon germanium deposition/growth processes and can be used in a salicide process to form silicide or germanicide on the source and drain regions as well as on the gate electrode. In certain embodiments of the present invention, a full silicidation (FUSI) is performed.

Figure 3J:
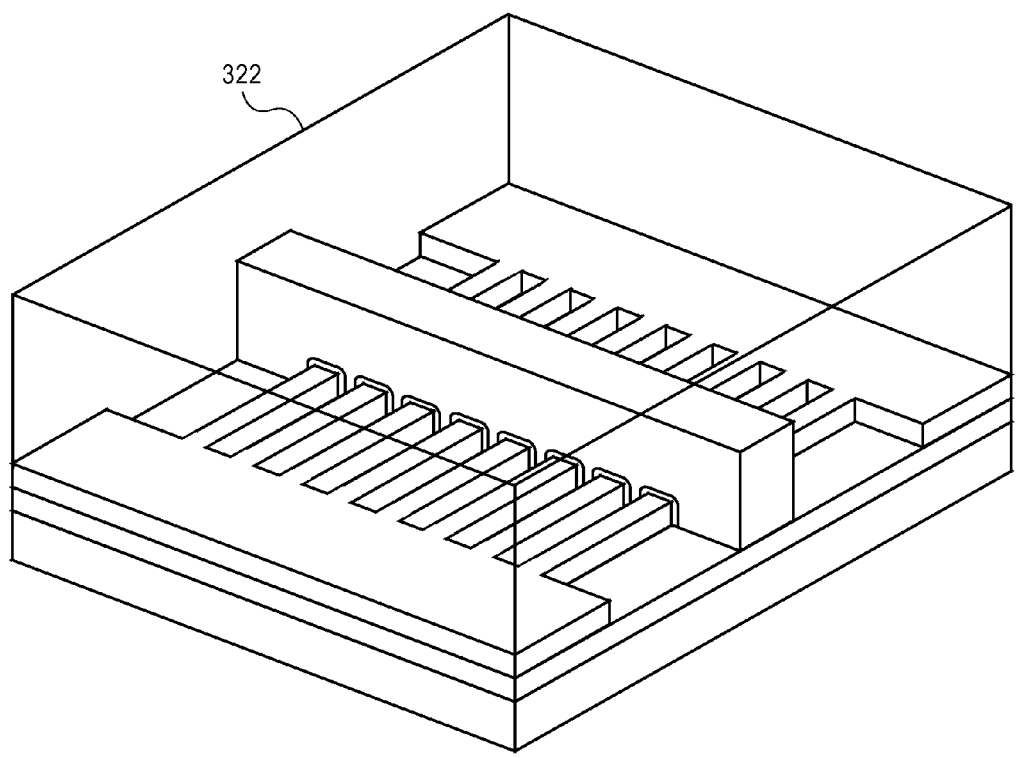

Next the device is encapsulated with an insulating layer, or interlayer dielectric (ILD) 322, as shown in FIG. 3J, having sufficient thickness to isolate the device. In certain embodiments of the present invention, the ILD 322 is commonly known material such as phosphosilicate glass (PSG), borophosphosilicate glass (BPSG), tetraethylorthosilicate (TEOS), silicon dioxide, silicon nitride, or a composite of such materials. In an embodiment of the present invention, the ILD 322 is a material having a lower dielectric constant than silicon dioxide, such as but not limited to a porous dielectric material, or carbon-doped silicate dielectric material. The ILD can be blanket deposited by commonly known processes such as but not limited to low pressure chemical vapor deposition (LPCVD), PECVD, and HDP.

Figure 3K:
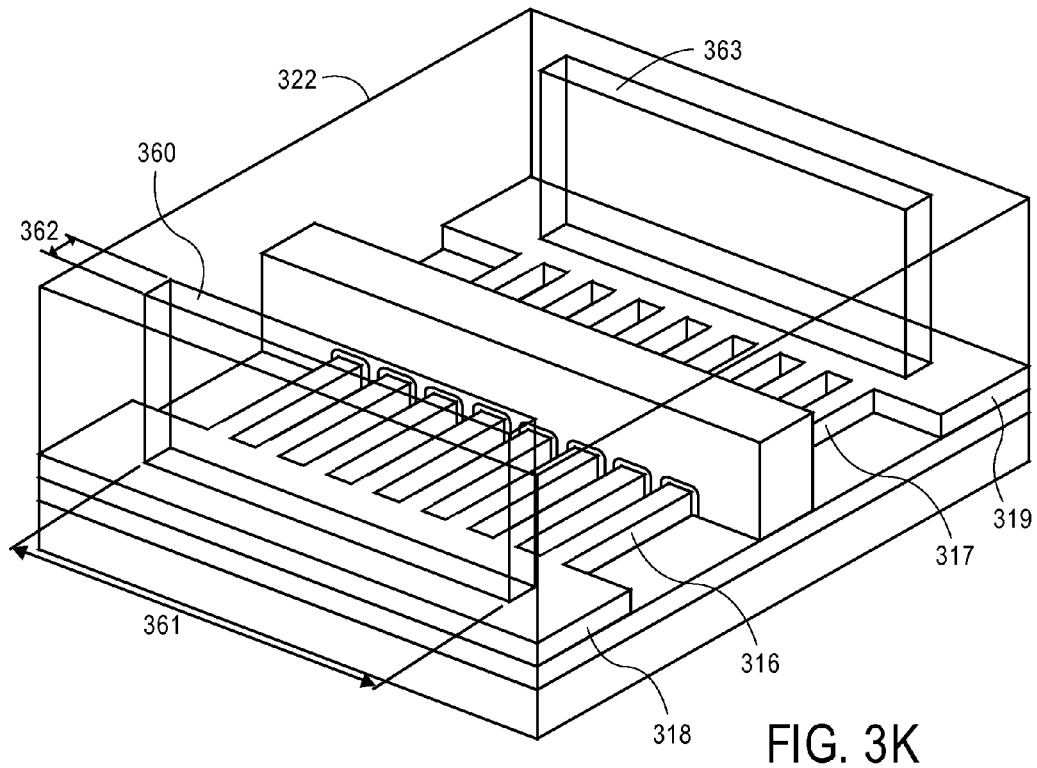

Next the ILD 322 is patterned and etched to define the location of openings for the metal contact structures 360 and 363, as shown in FIG. 3K. In certain embodiments of the present invention, the photolithography process used to define contact openings 360 and 363 have a minimum lithographic pitch greater than the pitch of the semiconductor bodies 305. In an embodiment of the present invention, the photolithography process used to define contact openings 360 and 363 is 193 nm. In an embodiment of the present invention, the contact openings 360 and 363 are formed having a width dimension 361 that is approximately equal to the number of semiconductor bodies 305 multiplied by the pitch of the semiconductor bodies 305 and a length 362 approximately equal to the minimum photolithographic feature size. In an embodiment of the present invention, the contact openings 360 and 363 have a width 361 greater than the pitch of the semiconductor bodies 305 but less than the number of semiconductor bodies 305 multiplied by the pitch of the semiconductor bodies 305 and a length 362 on the order of the minimum lithographic feature size. In certain embodiments of the present invention, the contact openings 360 and 363 have a width 361 significantly greater than length 362. In certain embodiments of the present invention, the contact openings 360 and 363 can be imaged as "one-dimensional" slots which can have a length 362 smaller than a length that would be possible if the contact opening was two-dimensional (having a width approximately the same as the length). In other embodiments of the present invention, the dimensions of the contact openings 360 and 363 are not equal.

In an embodiment of the present invention, contact openings 360 and 363 terminate on the source landing pad 318 or drain landing pad 319, respectively. In another embodiment of the present invention, where no source or drain landing pad is used the contact openings 360 and 363 are positioned to expose the plurality of source regions 316 and plurality of drain regions 317 respectively. In certain embodiments of the present invention, the contact openings are etched into ILD 322 with a commonly known anisotropic plasma or reactive ion etching process having sufficient selectivity to the semiconductor source regions 316 and drain regions 317 that the ILD 322 is completely removed to expose the non-planar source regions 316 and non-planar drain regions 317 (or landing pads 318 and 319).

Figure 3L:
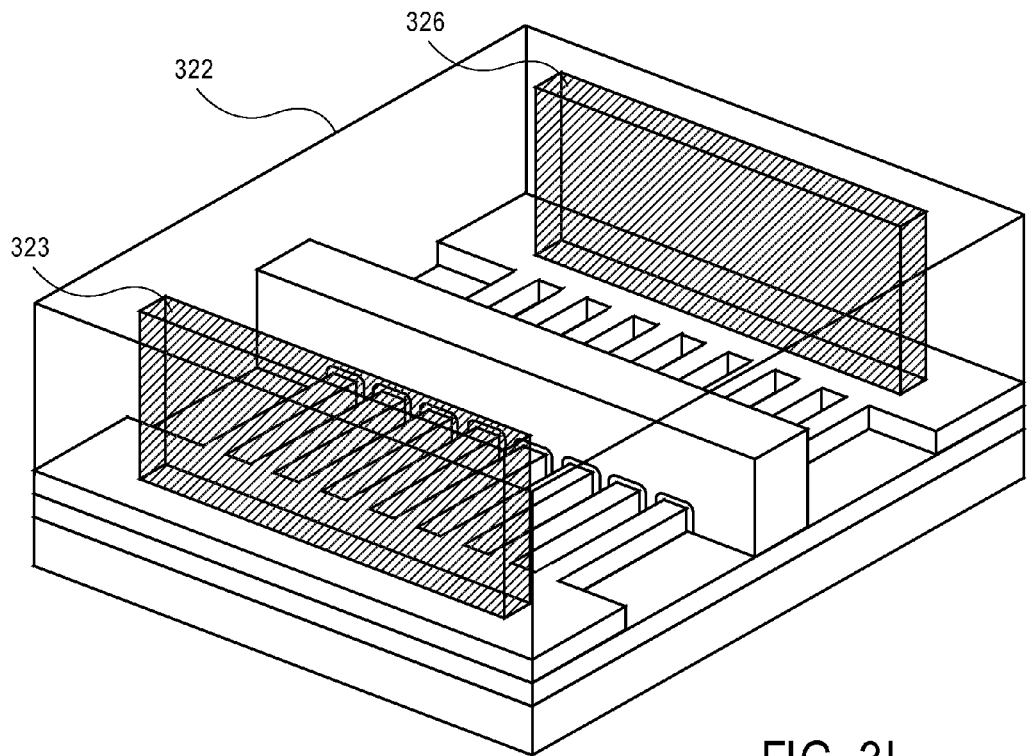

Next the contact openings 360 are filled with metallization to form metal contact structures 323 and 326 as shown in FIG. 3L. The contact structures 323 and 326 can be formed from a commonly known conductive material, such as but not limited to copper, tungsten, aluminum, gold, or carbon nanotubes. The filling of the contact openings 360 is performed by any currently known technique, such as but not limited to physical vapor deposition (PVD), CVD, ALD, electroless or electrolytic plating, or a combination of these techniques. If desired, the method of filling the contact openings 360 can include the deposition of a commonly known barrier layer such as but not limited to tantalum or tantalum nitride, or other intermetallics. If desired, the method of filling the contact openings 360 can include the deposition of a commonly known seed layer such as but not limited to copper, titanium, or other intermetallics.

Next the conductive material used to form the metal contact structures 323 and 326 as shown in FIG. 3L is polished back using commonly known electrolytic, chemical, mechanical removal means, or a combination thereof. In an embodiment of the present invention, a chemical mechanical polish (CMP) process is used in a damascene or dual damascene technique. In this manner, the conductive contact structures 323 and 326 can be planarized to be substantially level with the ILD 322 and subsequently interconnected with additional levels of metallization, if desired.

Thus, a device having a plurality of parallel nanoscale channels with a novel contact architecture and method of fabrication have been described.

We claim:

1. An apparatus comprising:
a plurality of parallel semiconductor bodies, each of the plurality having a top surface and a pair of laterally opposite sidewalls, each of said plurality having a channel region between a source region and a drain region;
a single gate electrode formed adjacent to and over said channel region of each of said plurality of bodies;
a first source contact to a source region of at least a first of the plurality of parallel semiconductor bodies;
a second source contact to a source region of at least a second, of the plurality of parallel semiconductor bodies, wherein the second source contact does not contact the first of the plurality of parallel semiconductor bodies and the first source contact does not contact the second of the plurality of parallel semiconductor bodies; and
a single drain contact to a drain region of at least both the first and second of the plurality of parallel semiconductor bodies, wherein the drain contact is of a same metallization level as the first and second source contacts.

2. The apparatus of claim 1, wherein said parallel bodies have a first width and a first pitch, wherein said first pitch is less than a pitch which can be defined by a photolithography process.

3. The apparatus of claim 2, wherein said photolithography process uses 193 nanometer lithography.

4. The apparatus of claim 2, wherein said first pitch is less than 110 nanometers.

5. The apparatus of claim 2, wherein said pitch is one half of said pitch which can be defined by said photolithography process.

6. The apparatus of claim 1, further comprising a single drain landing pad in direct contact with all of said drain regions of said plurality of parallel bodies, wherein said drain landing pad is of the same material as said plurality of parallel bodies and wherein said drain contact is in direct contact with said drain landing pad.

7. The apparatus of claim 1, wherein said plurality of parallel bodies formed from a material selected from the group consisting of silicon, germanium, silicon germanium, GaAs, InSb and carbon nanotubes.

8. The apparatus of claim 7, wherein said plurality of parallel bodies are formed on an insulating substrate.

9. The apparatus of claim 1, wherein at least one of the source contact or drain contact has a length that is substantially smaller than a width.

10. The apparatus of claim 1, wherein the drain contact further contacts a sidewall of the drain region of a semiconductor body having a source region not electrically coupled to either the first source contact or second source contact.

11. The apparatus of claim 1, wherein said parallel bodies have a first width and a first pitch, wherein said first pitch is less than the width of the drain contact.

12. The apparatus of claim 1, wherein said plurality of parallel bodies formed from a material selected from the group consisting of silicon, germanium, silicon germanium, GaAs, InSb and carbon nanotubes.

13. An apparatus comprising:
a plurality of parallel semiconductor bodies, each of the plurality having a top surface and a pair of laterally opposite sidewalls, each of said plurality having a channel region between a source region and a drain region;
a single gate electrode formed adjacent to and over said channel region of each of said plurality of bodies;
a first drain contact to a drain region of at least a first of the plurality of parallel semiconductor bodies;
a second drain contact to a drain region of at least a second of the plurality of parallel semiconductor bodies, wherein the second drain contact does not contact the first of the plurality of parallel semiconductor bodies and the first drain contact does not contact the second of the plurality of parallel semiconductor bodies; and
a single source contact to a source region of at least both the first and second of the plurality of parallel semiconductor bodies, wherein the source contact is of a same metallization level as the first and second drain contacts.

14. The apparatus of claim 13, further comprising a single source landing pad in direct contact with all of said source regions of said plurality of parallel bodies, wherein said source landing pad is of the same material as said parallel bodies and wherein said source contact is in direct contact with said source landing pad.

15. The apparatus of claim 13, wherein at least one of the source contact or drain contact has a length that is substantially smaller than a width.

16. The apparatus of claim 13, wherein the source contact further contacts a sidewall of the source region of a semiconductor body having a drain region not electrically coupled to either the first drain contact or second drain contact.

17. The apparatus of claim 13, wherein said parallel bodies have a first width and a first pitch, wherein said first pitch is less than the width of the source contact.

18. The apparatus of claim 13, wherein said plurality of parallel bodies formed from a material selected from the group consisting of silicon, germanium, silicon germanium, GaAs, InSb and carbon nanotubes.

19. An apparatus comprising:
a plurality of parallel semiconductor bodies, each of the plurality having a top surface and a pair of laterally opposite sidewalls, each of said plurality having a channel region between a source region and a drain region;
a single gate electrode formed adjacent to and over said channel region of each of said plurality of bodies;
a first source contact to a source region of at least a first of the plurality of parallel semiconductor bodies;
a second source contact to a source region of at least a second, different than the first, of the plurality of parallel semiconductor bodies; and
a single drain contact to a drain region of at least both the first and second of the plurality of parallel semiconductor bodies, wherein the single drain contact further contacts a sidewall of a drain region of at least a third of the plurality of parallel semiconductor bodies having a source region not electrically coupled to any source contact.

20. An apparatus comprising:
a plurality of parallel semiconductor bodies, each of the plurality having a top surface and a pair of laterally opposite sidewalls, each of said plurality having a channel region between a source region and a drain region;
a single gate electrode formed adjacent to and over said channel region of each of said plurality of bodies;
a first drain contact to a drain region of at least a first of the plurality of parallel semiconductor bodies;
a second drain contact to a drain region of at least a second, different than the first, of the plurality of parallel semiconductor bodies; and
a single source contact to a source region of at least both the first and second of the plurality of parallel semiconductor bodies, wherein the single source contact further contacts a sidewall of a source region of at least a third of the plurality of parallel semiconductor bodies having a drain region not electrically coupled to any drain contact.

* * * * *